US012765104B2

(12) United States Patent
Ejiri et al.

(10) Patent No.: US 12,765,104 B2
(45) Date of Patent: Oct. 13, 2026

(54) SEMICONDUCTOR DEVICE WITH RESISTOR AND METHOD FOR MANUFACTURING SAME

(71) Applicant: SONY SEMICONDUCTOR SOLUTIONS CORPORATION, Kanagawa (JP)

(72) Inventors: Hirokazu Ejiri, Kanagawa (JP); Jun Ogi, Kanagawa (JP); Yuki Kawahara, Kanagawa (JP); Chigusa Yamane, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 769 days.

(21) Appl. No.: 18/001,767

(22) PCT Filed: Apr. 6, 2021

(86) PCT No.: PCT/JP2021/014607
§ 371 (c)(1),
(2) Date: Dec. 14, 2022

(87) PCT Pub. No.: WO2022/004088
PCT Pub. Date: Jan. 6, 2022

(65) Prior Publication Data

US 2023/0275112 A1 Aug. 31, 2023

(30) Foreign Application Priority Data

Jun. 29, 2020 (JP) ................................ 2020-112088

(51) Int. Cl.
*H10F 39/00* (2025.01)
*H10D 1/47* (2025.01)
(Continued)

(52) U.S. Cl.
CPC ............ *H10F 39/811* (2025.01); *H10D 1/47* (2025.01); *H10D 1/474* (2025.01);
(Continued)

(58) Field of Classification Search
CPC ....... H01L 23/5228; H10D 1/47; H10D 1/474
See application file for complete search history.

(56) References Cited

U.S. PATENT DOCUMENTS 6,500,724 B1 * 12/2002 Zurcher ................ H10D 1/682 257/E21.582
2005/0224977 A1 * 10/2005 Yoshimura .......... H10W 20/038 438/653
(Continued)

FOREIGN PATENT DOCUMENTS

JP H0356558 A 3/1991
JP 2009-021509 1/2009
(Continued)

OTHER PUBLICATIONS

International Search Report and Written Opinion prepared by the Japan Patent Office on Jun. 24, 2021, for International Application No. PCT/JP2021/014607, 2 pgs.

*Primary Examiner* — Aaron J Gray
(74) *Attorney, Agent, or Firm* — SHERIDAN ROSS P.C.

(57) ABSTRACT

To provide a semiconductor device with which it is possible to reduce parasitic capacitance between electrodes for a resistance element, and a method for manufacturing the semiconductor device. A semiconductor device according to the present disclosure includes: a substrate; a first resistance layer provided on the substrate; a first electrode in contact with a lower surface of the first resistance layer; and a second electrode in contact with an upper surface of the first resistance layer.

19 Claims, 32 Drawing Sheets

(51) Int. Cl.
*H10F 30/225* (2025.01)
*H10W 20/40* (2026.01)

(52) U.S. Cl.
CPC ......... *H10F 30/225* (2025.01); *H10F 39/011* (2025.01); *H10W 20/498* (2026.01); *H10F 39/8063* (2025.01)

(56) References Cited

U.S. PATENT DOCUMENTS

| | | | | |
|---|---|---|---|---|
| 2007/0235880 | A1* | 10/2007 | Yang | H10W 20/493<br>257/E23.149 |
| 2009/0302993 | A1* | 12/2009 | Fujiwara | H10W 20/498<br>338/314 |
| 2018/0090498 | A1 | 3/2018 | Onuki et al. | |
| 2019/0326423 | A1 | 10/2019 | Kobayashi | |
| 2022/0157927 | A1* | 5/2022 | Leng | H10D 1/474 |

FOREIGN PATENT DOCUMENTS

| | | | |
|---|---|---|---|
| JP | 2009-302082 | | 12/2009 |
| JP | 2018-056558 | | 4/2018 |
| JP | 2018-201005 | | 12/2018 |
| JP | 2019-192690 | | 10/2019 |
| KR | 20050101020 | A | 10/2005 |
| SG | 10201707339 | | 4/2018 |
| TW | 2018-34208 | | 9/2018 |
| TW | I689992 | B | 4/2020 |
| WO | WO 2018/174090 | | 9/2018 |

* cited by examiner

SEMICONDUCTOR DEVICE WITH RESISTOR AND METHOD FOR MANUFACTURING SAME

CROSS REFERENCE TO RELATED APPLICATIONS

This application is a national stage application under 35 U.S.C. 371 and claims the benefit of PCT Application No. PCT/JP2021/014607, having an international filing date of 6 Apr. 2021, which designated the United States, which PCT application claimed the benefit of Japanese Patent Application No. 2020-112088, filed 29 Jun. 2020, the entire disclosures of each of which are incorporated herein by reference.

TECHNICAL FIELD

The present disclosure relates to a semiconductor device and a method for manufacturing the same.

BACKGROUND ART

In a configuration in which a resistance element (resistance layer) is disposed on a substrate, a structure in which the resistance element is disposed between wiring layers on the substrate is known. This structure can increase the distance between the substrate and the resistance element, and thus, can achieve a resistance element having a small parasitic capacitance.

In this case, due to two extraction electrodes being disposed between a certain wiring layer and the resistance element, the wiring layer and the resistance element can be electrically connected. Examples of such electrodes include via plugs and contact plugs.

CITATION LIST

Patent Document

Patent Document 1: Japanese Patent Application Laid-Open No. 2009-021509
Patent Document 2: Japanese Patent Application Laid-Open No. 2018-201005
Patent Document 3: WO 2018/174090

SUMMARY OF THE INVENTION

Problems to be Solved by the Invention

In a case where the resistance element is disposed as described above, there is a problem that the parasitic capacitance between the electrodes increases when the resistance element is miniaturized or downsized. The reason is that the distance between the electrodes is decreased due to miniaturization and downsizing of the resistance element. An increase in the parasitic capacitance between the electrodes is an obstructive factor in promoting an increase in speed and reduction in power consumption of a semiconductor device.

In view of this, the present disclosure provides a semiconductor device capable of reducing parasitic capacitance between electrodes for resistance elements, and a method for manufacturing the semiconductor device.

Solutions to Problems

A semiconductor device according to a first aspect of the present disclosure includes: a substrate; a first resistance layer provided on the substrate; a first electrode in contact with a lower surface of the first resistance layer; and a second electrode in contact with an upper surface of the first resistance layer. With this configuration, parasitic capacitance between the first and second electrodes that are electrodes for the first resistance layer can be reduced, for example.

In addition, the semiconductor device according to the first aspect may further include: a first wire in contact with a lower surface of the first electrode; and a second wire in contact with an upper surface of the second electrode. With this configuration, the parasitic capacitance of the first resistance layer disposed between wiring layers can be reduced, for example.

In addition, in the first aspect, the first electrode may be in contact with an upper surface of the substrate. With this configuration, the parasitic capacitance of the first resistance layer disposed between the substrate and the wiring layer can be reduced, for example.

In addition, in the first aspect, the first resistance layer may include a first layer and a second layer having an electrical resistivity lower than an electrical resistivity of the first layer, and the second layer may include a first portion that is provided on a side of the first electrode and a second portion that is provided on a side of the second electrode and is separated from the first portion. With this configuration, the resistance value of the first resistance layer can be easily set to a desired value, for example.

In addition, in the first aspect, the first electrode may be disposed at a position vertically overlapping the first portion, and the second electrode may be disposed at a position vertically overlapping the second portion. With this configuration, the resistance value of the first resistance layer can be adjusted to a desired value by the portion of the first layer sandwiched between the first portion and the second portion, for example.

In addition, in the first aspect, the first layer may contain a metal element and a silicon element. With this configuration, the first layer can be a cermet layer, for example.

In addition, in the first aspect, the second layer may be provided on a lower surface of the first layer. With this configuration, it is possible to suppress a step of forming the first layer from adversely affecting the first electrode, for example.

In addition, in the first aspect, the second layer may be provided on an upper surface of the first layer. With this configuration, in a case where the fact that the step of forming the first layer adversely affects the first electrode is not a problem, the second layer can be provided on the upper surface of the first layer, for example.

In addition, in the first aspect, the second electrode may penetrate the first layer. With this configuration, a hole for the second electrode can be formed using the second layer as a stopper, for example.

In addition, in the first aspect, the second electrode may be in contact with the second layer. With this configuration, a hole for the second electrode can be formed using the second layer as a stopper, for example.

In addition, in the first aspect, the second layer may have a tapered side surface, and the first layer may be in contact with an upper surface and the tapered side surface of the second layer. With this configuration, break of the first layer can be prevented, for example.

In addition, the semiconductor device according to the first aspect may further include: a second resistance layer provided on the substrate; a third electrode that is in contact with a lower surface of the second resistance layer and is electrically connected to the second electrode; and a fourth electrode in contact with an upper surface of the second resistance layer. With this configuration, a structure in which the first resistance layer and the second resistance layer are connected in series can be achieved, and in this case, the parasitic capacitance between the electrodes for the first resistance layer and the parasitic capacitance between the electrodes for the second resistance layer can be reduced, for example.

In addition, the semiconductor device according to the first aspect may further include: a first wire in contact with a lower surface of the first electrode; a second wire in contact with an upper surface of the second electrode and a lower surface of the third electrode; and a third wire in contact with an upper surface of the fourth electrode. With this configuration, the parasitic capacitance of the second resistance layer disposed between wiring layers can be reduced, for example.

In addition, in the first aspect, at least one of a set of the second electrode and the second wire or a set of the third electrode and the third wire may form a dual damascene wire. With this configuration, the second electrode can be easily formed together with the second wire, and the third electrode can be easily formed together with the third wire, for example.

In addition, in the first aspect, the first resistance layer may be provided between a photoelectric conversion element and a signal processing circuit. This makes it possible to suppress supply of a large amplitude voltage signal to the signal processing circuit from the photoelectric conversion element, for example.

In addition, in the first aspect, the photoelectric conversion element may be provided in the substrate. This makes it possible to suppress supply of a large amplitude voltage signal to the signal processing circuit from the substrate, for example.

In addition, in the first aspect, the photoelectric conversion element may be a single photon avalanche diode (SPAD). This makes it possible to suppress supply of a large amplitude signal to the signal processing circuit from the photoelectric conversion element in which a large amplitude signal is likely to occur, for example.

In addition, in the first aspect, the substrate may include a first surface on which the first resistance layer, the first electrode, and the second electrode are provided, and a second surface provided with a lens that allows light to enter the photoelectric conversion element. With this configuration, a back-illuminated solid-state imaging device can be achieved, for example.

A method for manufacturing a semiconductor device according to a second aspect of the present disclosure includes: forming a first electrode on a substrate; forming a first resistance layer in contact with an upper surface of the first electrode; and forming a second electrode in contact with an upper surface of the first resistance layer. With this configuration, parasitic capacitance between the first and second electrodes that are electrodes for the first resistance layer can be reduced, for example.

In addition, in the second aspect, the first resistance layer may be formed to have a first layer and a second layer having an electrical resistivity lower than an electrical resistivity of the first layer, and the second layer may be formed to have a first portion that is provided on a side of the first electrode and a second portion that is provided on a side of the second electrode and is separated from the first portion. With this configuration, the resistance value of the first resistance layer can be easily set to a desired value, for example.

MODE FOR CARRYING OUT THE INVENTION

Embodiments of the present disclosure will be described below with reference to the drawings.

First Embodiment

Figure 1:
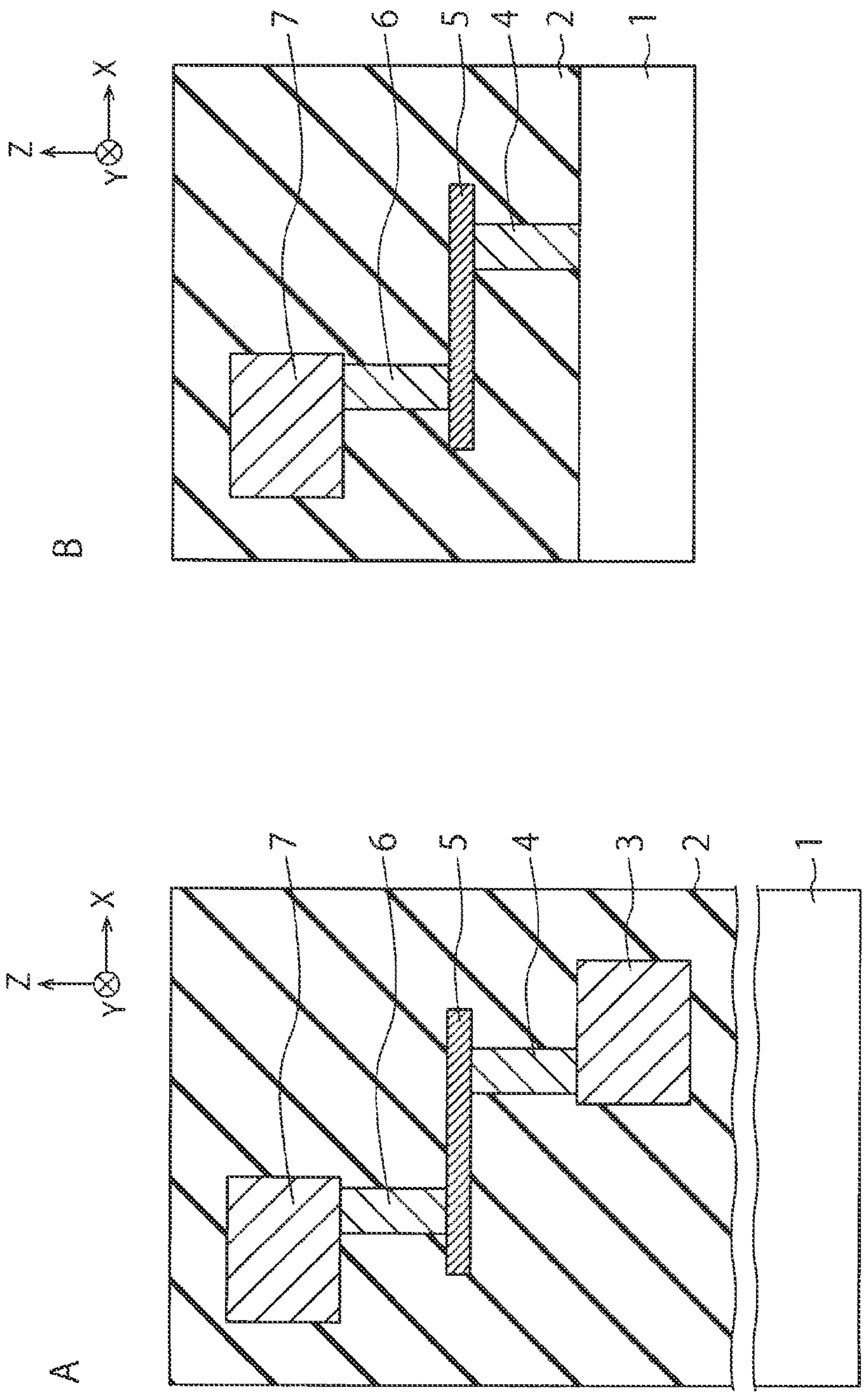
FIG. 1 is a cross-sectional view depicting a structure of a semiconductor device according to a first embodiment.

FIG. 1 is a cross-sectional view depicting a structure of a semiconductor device according to the first embodiment.

A of FIG. 1 illustrates a first example of the structure of the semiconductor device according to the present embodiment. The semiconductor device illustrated in A of FIG. 1 includes a substrate 1, an interlayer insulating film 2, a wire 3, a plug electrode 4, a resistance layer (resistance element) 5, a plug electrode 6, and a wire 7. The wire 3 is an example of a first wire in the present disclosure, and the plug electrode 4 is an example of a first electrode in the present disclosure. The resistance layer 5 is an example of a first resistance layer in the present disclosure. The plug electrode 6 is an example of a second electrode in the present disclosure, and the wire 7 is an example of a second wire in the present disclosure.

A of FIG. 1 illustrates an X axis, a Y axis, and a Z axis which are mutually orthogonal. The X direction and the Y direction correspond to a lateral direction (horizontal direction), and the Z direction corresponds to a longitudinal direction (vertical direction). In addition, the +Z direction corresponds to an upward direction, and the −Z direction corresponds to a downward direction. The −Z direction may strictly match the gravity direction, or may not strictly match the gravity direction.

The substrate 1 is, for example, a semiconductor substrate such as a silicon substrate. The interlayer insulating film 2 is formed on the substrate 1. The interlayer insulating film 2 is, for example, a silicon oxide film or a multilayer film including a silicon oxide film and other insulating films. The wire 3, the plug electrode 4, the resistance layer 5, the plug electrode 6, and the wire 7 are formed in the interlayer insulating film 2 on the substrate 1.

The wire 3 is provided in one wiring layer formed above the substrate 1. The wire 3 is, for example, a metal layer including an aluminum (Al) layer, a tungsten (W) layer, or a copper (Cu) layer. The wire 3 may be electrically connected to the substrate 1 directly or indirectly.

The plug electrode 4 is formed on the wire 3 and is electrically connected to the wire 3. The lower surface of the plug electrode 4 is in contact with the upper surface of the wire 3. The plug electrode 4 is, for example, a metal layer including an Al layer, a W layer, or a Cu layer. The plug electrode 4 is, for example, a via plug.

The resistance layer 5 is formed on the plug electrode 4 and is electrically connected to the plug electrode 4. The lower surface of the resistance layer 5 is in contact with the upper surface of the plug electrode 4. The resistance layer 5 is, for example, an oxide film, a nitride film, or an oxynitride film containing a metal element. Examples of the metal element include high melting point metal elements such as a Ta (tantalum) element and a Ti (titanium) element. The resistance layer 5 may further contain a silicon (Si) element. Examples of the resistance layer 5 described above include a cermet layer such as a TaSiO layer or a TiSiO layer.

The plug electrode 6 is formed on the resistance layer 5 and is electrically connected to the resistance layer 5. The lower surface of the plug electrode 6 is in contact with the upper surface of the resistance layer 5. The plug electrode 6 is, for example, a metal layer including an Al layer, a W layer, or a Cu layer. The plug electrode 6 is, for example, a via plug.

The wire 7 is provided in one wiring layer formed above the substrate 1, and is included in a wiring layer different from the wiring layer including the wire 3. Therefore, the resistance layer 5 is disposed between these wiring layers. The wire 7 is formed on the plug electrode 6 and is electrically connected to the plug electrode 6. The lower surface of the wire 7 is in contact with the upper surface of the plug electrode 6. The wire 7 is, for example, a metal layer including an Al layer, a W layer, or a Cu layer.

The resistance layer 5 illustrated in A of FIG. 1 is in contact with the plug electrodes 4 and 6 functioning as extraction electrodes. These plug electrodes 4 and 6 are in contact with different surfaces of the resistance layer 5. Specifically, the plug electrode 4 is in contact with the lower surface of the resistance layer 5, and the plug electrode 6 is in contact with the upper surface of the resistance layer 5. Therefore, these plug electrodes 4 and 6 are in contact with different wiring layers and are in contact with the wires 3 and 7, respectively.

B of FIG. 1 illustrates a second example of the structure of the semiconductor device according to the present embodiment. The semiconductor device illustrated in B of FIG. 1 includes a substrate 1, an interlayer insulating film 2, a plug electrode 4, a resistance layer 5, a plug electrode 6, and a wire 7, as in the semiconductor device illustrated in A of FIG. 1.

It is to be noted, however, that the plug electrode 4 illustrated in B of FIG. 1 is formed directly on the substrate 1 and is electrically connected to the substrate 1. The lower surface of the plug electrode 4 is in contact with the upper surface of the substrate 1. The plug electrode 4 is, for example, a contact plug. The resistance layer 5 illustrated in A of FIG. 1 is disposed between two wiring layers, whereas the resistance layer 5 illustrated in B of FIG. 1 is disposed between the substrate 1 and one wiring layer.

Figure 2:
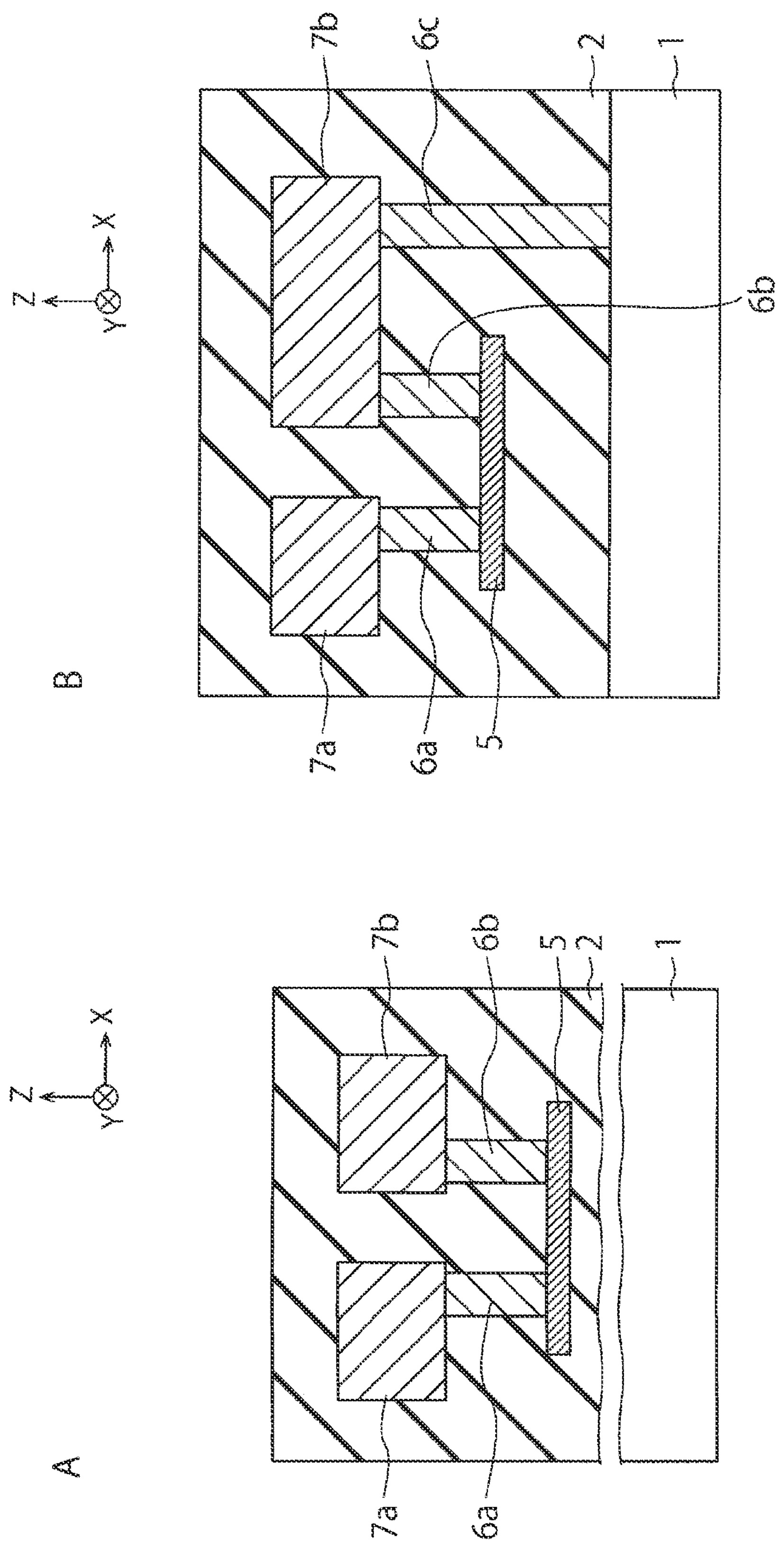
FIG. 2 is a cross-sectional view depicting a structure of a semiconductor device according to a comparative example of the first embodiment.

FIG. 2 is a cross-sectional view depicting a structure of a semiconductor device according to a comparative example of the first embodiment.

A of FIG. 2 illustrates a first example of the structure of the semiconductor device according to the present comparative example. The semiconductor device illustrated in A of FIG. 2 includes a substrate 1, an interlayer insulating film 2, a resistance layer 5, two plug electrodes 6*a* and 6*b*, and two wires 7*a* and 7*b*.

The plug electrodes 4 and 6 illustrated in A of FIG. 1 are in contact with different surfaces of the resistance layer 5, whereas the plug electrodes 6*a* and 6*b* illustrated in A of FIG. 2 are in contact with the same surface of the resistance layer 5. Specifically, the plug electrodes 6*a* and 6*b* are both in contact with the upper surface of the resistance layer 5. Therefore, the plug electrodes 6*a* and 6*b* are in contact with the same wiring layer, and are in contact with different wires 7*a* and 7*b* in the wiring layer, respectively. The plug electrodes 6*a* and 6*b* are via plugs, for example.

B of FIG. 2 illustrates a second example of the structure of the semiconductor device according to the present comparative example. The semiconductor device illustrated in B of FIG. 2 includes a substrate 1, an interlayer insulating film 2, a resistance layer 5, two plug electrodes 6*a* and 6*b*, and two wires 7*a* and 7*b*, as in the semiconductor device illustrated in A of FIG. 2, and further includes a plug electrode 6*c*.

The plug electrode 6*c* is formed on the substrate 1 and under the wire 7*b*, and electrically connects the substrate 1 and the wire 7*b*. The plug electrode 6*c* is in contact with the upper surface of the substrate 1 and is in contact with the lower surface of the wire 7*b*. The plug electrode 6*c* is, for example, a contact plug.

Figure 3:
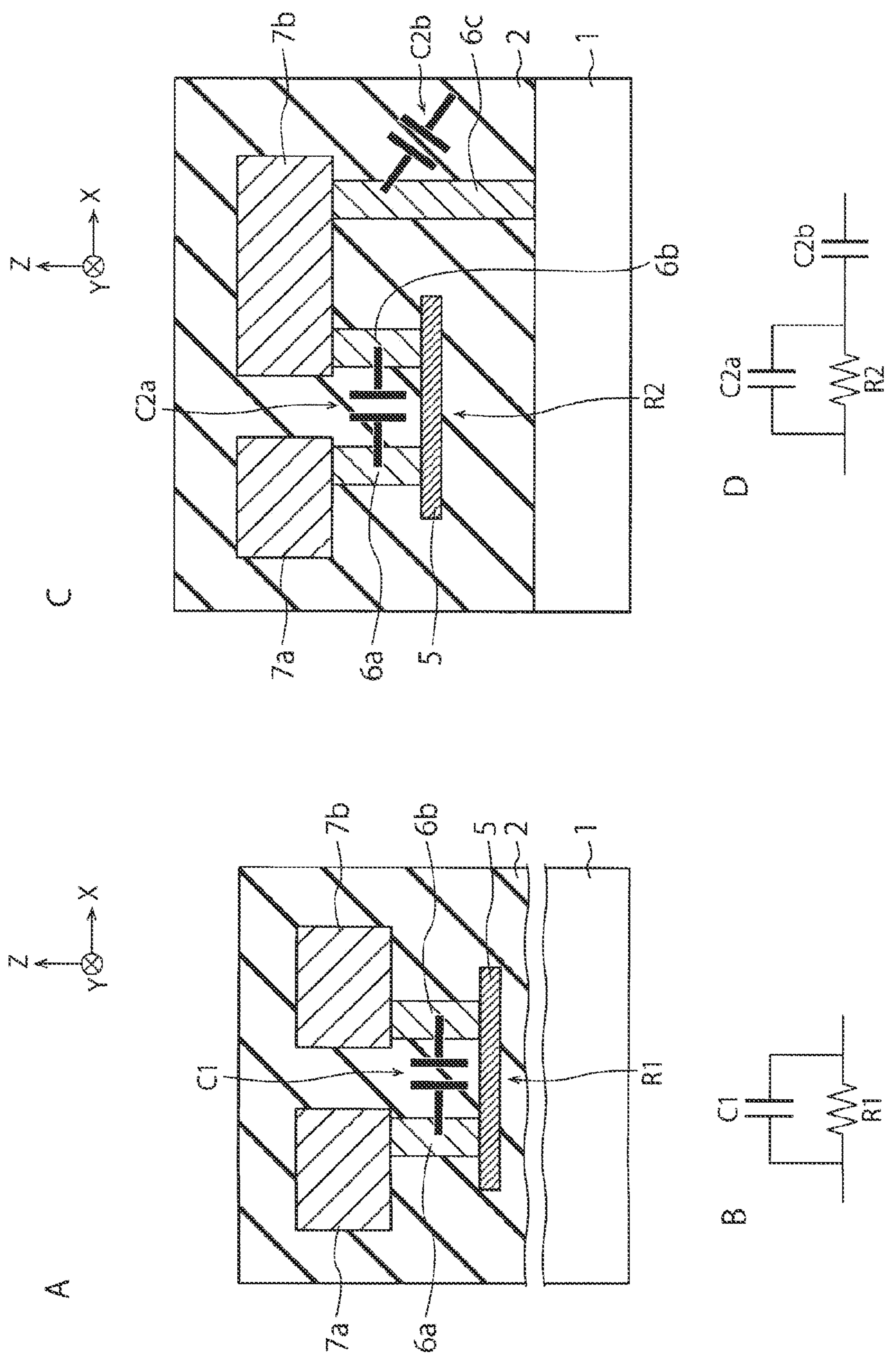
FIG. 3 is a cross-sectional view for describing a drawback of the semiconductor device according to the comparative example of the first embodiment.

FIG. 3 is a cross-sectional view for describing a drawback of the semiconductor device according to the comparative example of the first embodiment.

A of FIG. 3 illustrates an electric resistance R1 in the resistance layer 5 illustrated in A of FIG. 2 and a parasitic capacitance C1 between the plug electrodes 6*a* and 6*b* illustrated in A of FIG. 2. B of FIG. 3 is a circuit diagram illustrating a connection relationship between the electric resistance R1 and the parasitic capacitance C1.

In this example, the plug electrodes 6*a* and 6*b* are in contact with the same surface of the resistance layer 5. Therefore, when the resistance layer 5 is miniaturized or downsized, the distance between the plug electrodes 6*a* and 6*b* tends to be decreased. As the distance between the plug electrodes 6*a* and 6*b* decreases, the parasitic capacitance C1 increases. An increase in the parasitic capacitance C1 is an obstructive factor in promoting an increase in speed and a reduction in power consumption of a semiconductor device.

C of FIG. 3 illustrates an electric resistance R2 in the resistance layer 5 illustrated in B of FIG. 2, a parasitic capacitance C2*a* between the plug electrodes 6*a* and 6*b* illustrated in B of FIG. 2, and a parasitic capacitance C2*b* between the substrate 1 and the plug electrode 6*c* illustrated in B of FIG. 2. D of FIG. 3 is a circuit diagram illustrating a connection relationship between the electric resistance R2 and the parasitic capacitances C2*a* and C2*b*.

In this example, the parasitic capacitance C2*b* is generated in addition to the parasitic capacitance C2*a* near the resistance layer 5. Therefore, when the resistance layer 5 is miniaturized or downsized, not only the parasitic capacitance C2*a* increases, but also the parasitic capacitance C2*b* may increase. An increase in the parasitic capacitances C2*a* and C2*b* is an obstructive factor in promoting an increase in speed and a reduction in power consumption of the semiconductor device.

Figure 4:
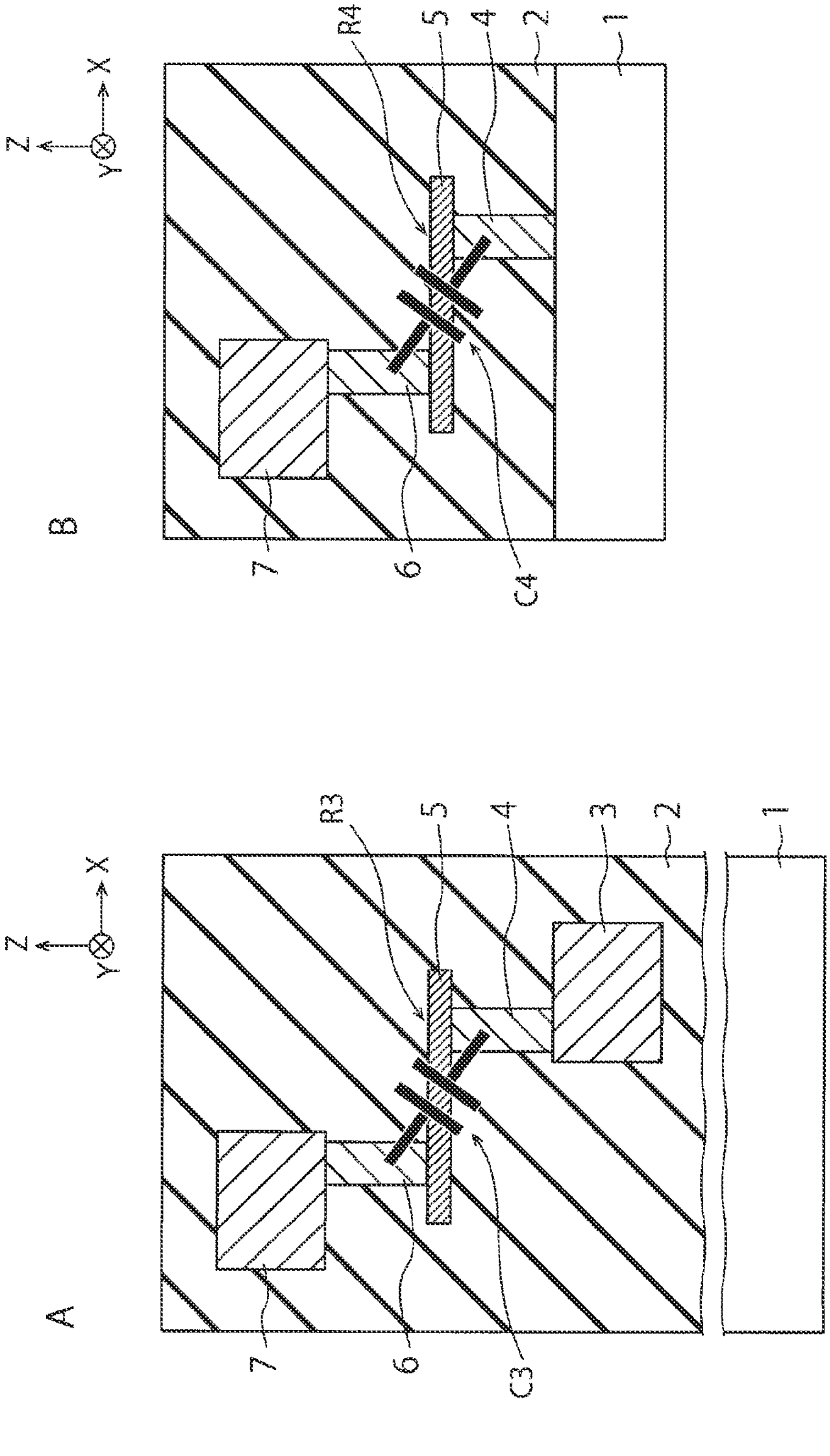
FIG. 4 is a cross-sectional view for describing an advantage of the semiconductor device according to the first embodiment.

FIG. 4 is a cross-sectional view for describing an advantage of the semiconductor device according to the first embodiment.

A of FIG. 4 illustrates an electric resistance R3 in the resistance layer 5 illustrated in A of FIG. 1 and a parasitic capacitance C3 between the plug electrodes 4 and 6 illustrated in A of FIG. 1.

In this example, the plug electrodes 4 and 6 are in contact with different surfaces of the resistance layer 5. Therefore, even when the resistance layer 5 is miniaturized or downsized, the distance between the plug electrodes 4 and 6 is less likely to be decreased. For example, the distance between the plug electrodes 4 and 6 illustrated in A of FIG. 4 is longer than the distance between the plug electrodes 6*a* and 6*b* illustrated in A of FIG. 3. Therefore, according to the present embodiment, the parasitic capacitance C3 can be reduced, and it is possible to promote an increase in speed and a reduction in power consumption of the semiconductor device.

B of FIG. 4 illustrates an electric resistance R4 in the resistance layer 5 illustrated in B of FIG. 1 and a parasitic capacitance C4 between the plug electrodes 4 and 6 illustrated in B of FIG. 1.

In this example, the plug electrodes 4 and 6 are also in contact with different surfaces of the resistance layer 5. Therefore, even when the resistance layer 5 is miniaturized or downsized, the distance between the plug electrodes 4 and 6 is less likely to be decreased. For example, the distance between the plug electrodes 4 and 6 illustrated in B of FIG. 4 is longer than the distance between the plug electrodes 6*a* and 6*b* illustrated in C of FIG. 3. Therefore, according to the present embodiment, the parasitic capacitance C4 can be reduced, and it is possible to promote an increase in speed and a reduction in power consumption of the semiconductor device.

In addition, in this example, the plug electrode 6*b*, the wire 7*b*, and the plug electrode 6*c* illustrated in C of FIG. 3 are replaced with the plug electrode 4 illustrated in B of FIG. 4. Therefore, in this example, a parasitic capacitance corresponding to the parasitic capacitance C2*b* is not generated in the vicinity of the resistance layer 5 illustrated in B of FIG. 4. This also contributes to reduction of parasitic capacitance in the vicinity of the resistance layer 5. Therefore, according to the present embodiment, by adopting the structure of this example, the wiring structure in the vicinity of the resistance layer 5 can be simplified, and a reduction in the chip area of the semiconductor device and a reduction in the parasitic capacitance can be achieved.

It has been found from the verification that the parasitic capacitance in the case of B of FIG. 4 is reduced by about 60% as compared with the case of C of FIG. 3 when the resistance width and the resistance length of the resistance layer 5 are 0.2 μm and 2.0 μm, respectively.

As described above, the plug electrodes 4 and 6 of the present embodiment are disposed so as to be in contact with different surfaces of the resistance layer 5. Therefore, according to the present embodiment, the distance between the plug electrodes 4 and 6 can be increased, and the parasitic capacitance between the plug electrodes 4 and 6 can be reduced.

Second Embodiment

Figure 5:
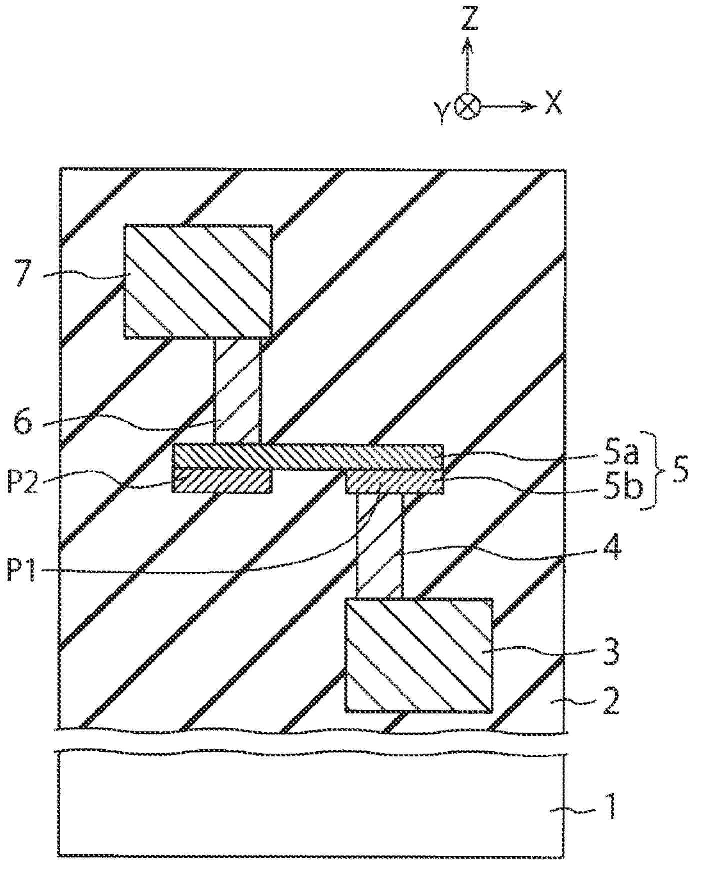
FIG. 5 is a cross-sectional view depicting a structure of a semiconductor device according to a second embodiment.

FIG. 5 is a cross-sectional view depicting a structure of a semiconductor device according to the second embodiment.

Similar to the semiconductor device illustrated in A of FIG. 1, the semiconductor device according to the present embodiment includes a substrate 1, an interlayer insulating film 2, a wire 3, a plug electrode 4, a resistance layer 5, a plug electrode 6, and a wire 7. In addition, the resistance layer 5 in the present embodiment includes a high-resistance layer 5*a* which is an example of a first layer in the present disclosure and a low-resistance layer 5*b* which is an example of a second layer in the present disclosure.

The high-resistance layer 5*a* has an electrical resistivity higher than the electrical resistivity of the low-resistance layer 5*b*. The electrical resistivity of the high-resistance layer 5*a* is, for example, 10 times or more the electrical resistivity of the low-resistance layer 5*b*, and preferably 100 times to 10,000 times the electrical resistivity of the low-resistance layer 5*b*.

Similar to the resistance layer 5 in the first embodiment, the high-resistance layer 5*a* is, for example, an oxide film, a nitride film, or an oxynitride film containing a metal element. Examples of the metal element include high melting point metal elements such as a Ta (tantalum) element and a Ti (titanium) element. The high-resistance layer 5*a* may further contain a Si element. Examples of the high-resistance layer 5*a* described above include a cermet layer such as a TaSiO layer or a TiSiO layer.

The low-resistance layer 5*b* is, for example, a single-component metal layer, alloy layer, oxide film, nitride film, or oxynitride film containing a metal element. Examples of the metal element include a high melting point metal element. The low-resistance layer 5*b* desirably exhibits satisfactory conductivity with the high-resistance layer 5*a*. Examples of the low-resistance layer 5*b* in the present embodiment include an Al—Ni(B) alloy layer (Al, Ni, and B represent aluminum, nickel, and boron, respectively).

In FIG. 5, the low-resistance layer 5*b* is formed on the plug electrode 4 and is electrically connected to the plug electrode 4. The lower surface of the low-resistance layer 5*b* is in contact with the upper surface of the plug electrode 4. In FIG. 5, the high-resistance layer 5*a* is further formed on the low-resistance layer 5*b*, and is electrically connected to the low-resistance layer 5*b*. The lower surface of the high-resistance layer 5*a* is in contact with the upper surface of the low-resistance layer 5*b*. In FIG. 5, the plug electrode 6 is further formed on the high-resistance layer 5*a* and electrically connected to the high-resistance layer 5*a*. The lower surface of the plug electrode 6 is in contact with the upper surface of the high-resistance layer 5*a*.

The low-resistance layer 5*b* is divided into a first portion P1 provided on the plug electrode 4 side and a second portion P2 provided on the plug electrode 6 side. Therefore, the low-resistance layer 5*b* includes two portions separated from each other, that is, the first portion P1 and the second portion P2. In addition, the plug electrode 4 is disposed at a position overlapping the first portion P1 in the vertical direction (±Z direction). On the other hand, the plug electrode 6 is disposed at a position overlapping the second portion P2 in the vertical direction (±Z direction).

Therefore, when a current flows in the resistance layer 5, the current mainly flows in the low-resistance layer 5*b* (first portion P1) instead of the high-resistance layer 5*a* in the vicinity of the plug electrode 4, and also mainly flows in the low-resistance layer 5*b* (second portion P2) instead of the high-resistance layer 5*a* in the vicinity of the plug electrode 6. The reason is that the current easily flows through a portion having a low electric resistance.

On the other hand, when a current flows between the first portion P1 and the second portion P2 in the resistance layer 5, the current flows in the high-resistance layer 5*a*. The reason is that the low-resistance layer 5*b* is divided between the first portion P1 and the second portion P2.

As a result, the electric resistance of the resistance layer 5 is mainly determined by the portion of the high-resistance layer 5*a* sandwiched between the first portion P1 and the second portion P2. Therefore, according to the present embodiment, the value of the electric resistance of the resistance layer 5 can be adjusted to a desired value by adjusting the distance between the first portion P1 and the second portion P2 or the like.

Figure 6:
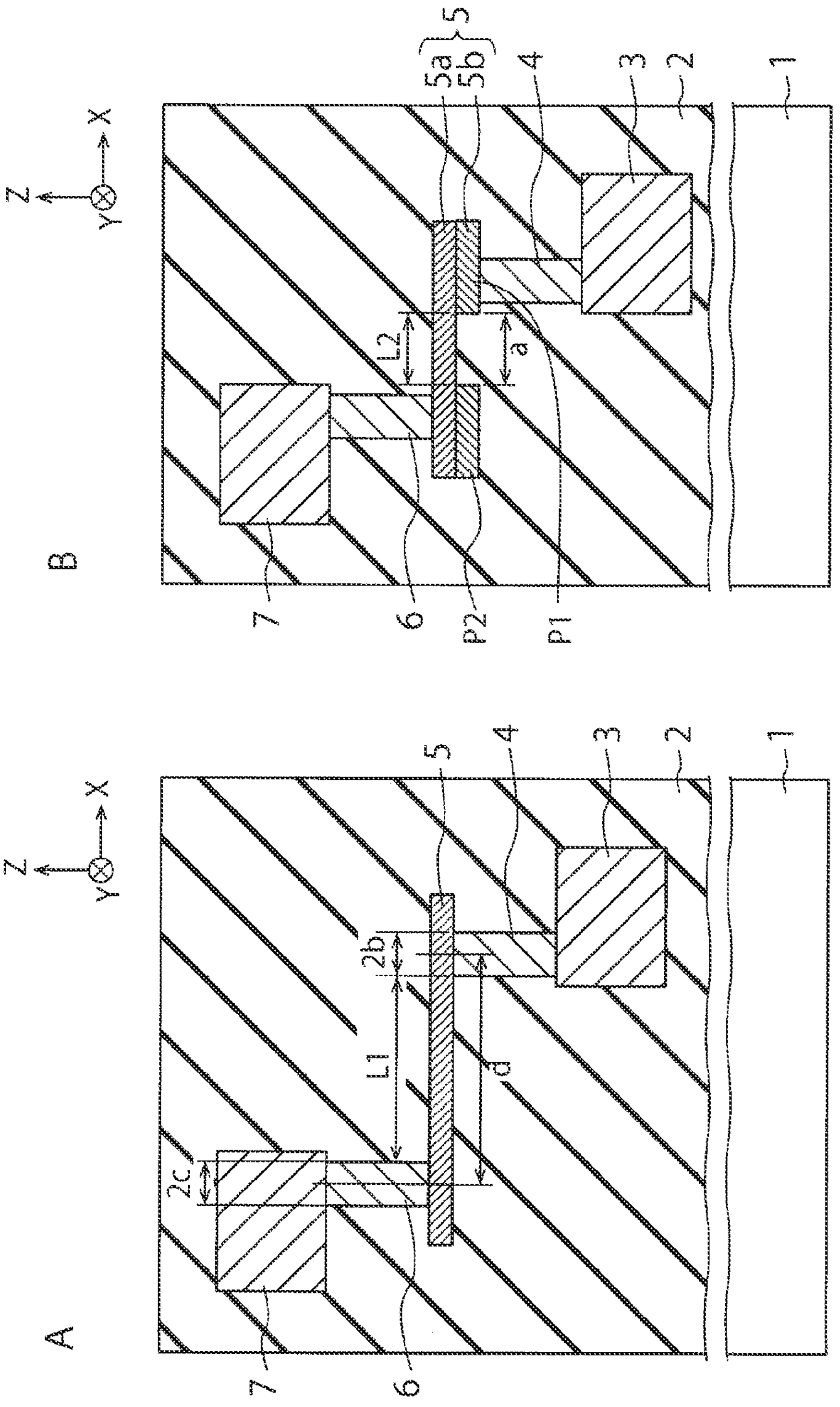
FIG. 6 is a cross-sectional view for describing an advantage of the semiconductor device according to the second embodiment.

FIG. 6 is a cross-sectional view for describing an advantage of the semiconductor device according to the second embodiment.

A of FIG. 6 illustrates various dimensions of the semiconductor device illustrated in A (first embodiment) of FIG. 1. A of FIG. 6 illustrates a resistance length "L1" of the resistance layer 5, a width "2*b*" of the plug electrode 4, a width "2*c*" of the plug electrode 6, and a distance "d" between the central axis of the plug electrode 4 and the central axis of the plug electrode 6. The resistance length L1 generally corresponds to the shortest distance between the plug electrodes 4 and 6.

In A of FIG. 6, the electric resistance of the resistance layer 5 between the plug electrodes 4 and 6 is proportional to the resistance length L1. Therefore, when the value of the resistance length L1 varies during manufacture of the semiconductor device, the value of the electric resistance of the resistance layer 5 varies. On the other hand, the variation in the value of the resistance layer L1 depends on three parameters b, c, and d. In a case where these variation parameters are represented as Δb, Δc, and Δd, respectively, and they vary irrelevantly, the variation of the value of the resistance layer L1 depends on a value of $(\Delta b^2+\Delta c^2+\Delta d^2)^{1/2}$. Therefore, in order to adjust the value of the electric resistance of the resistance layer 5 with high accuracy in A of FIG. 6, it is necessary to adjust three dimensions b, c, and d with high accuracy, and thus, it is difficult to adjust the value of the electric resistance of the resistance layer 5 with high accuracy.

B of FIG. 6 illustrates various dimensions of the semiconductor device illustrated in FIG. 5 (the present embodiment). B of FIG. 6 illustrates a resistance length "L2" of the resistance layer 5 and a width "a" that is the gap between the first portion P1 and the second portion P2. The resistance length L2 corresponds to the shortest distance between the first and second portions P1 and P2.

In B of FIG. 6, the electric resistance of the resistance layer 5 between the plug electrodes 4 and 6 is mainly determined by the portion of the high-resistance layer 5*a* sandwiched between the first portion P1 and the second portion P2, and is substantially proportional to the resistance length L2. Therefore, when the value of the resistance length L2 varies during manufacture of the semiconductor device, the value of the electric resistance of the resistance layer 5 varies. On the other hand, the variation in the value of the resistance layer L2 depends on a single parameter a. Therefore, in B of FIG. 6, the value of the electric resistance of the resistance layer 5 can be adjusted with high accuracy by adjusting one dimension a with high accuracy. As described above, according to the present embodiment, the value of the electric resistance of the resistance layer 5 can be adjusted with high accuracy by simple adjustment.

Figure 7:
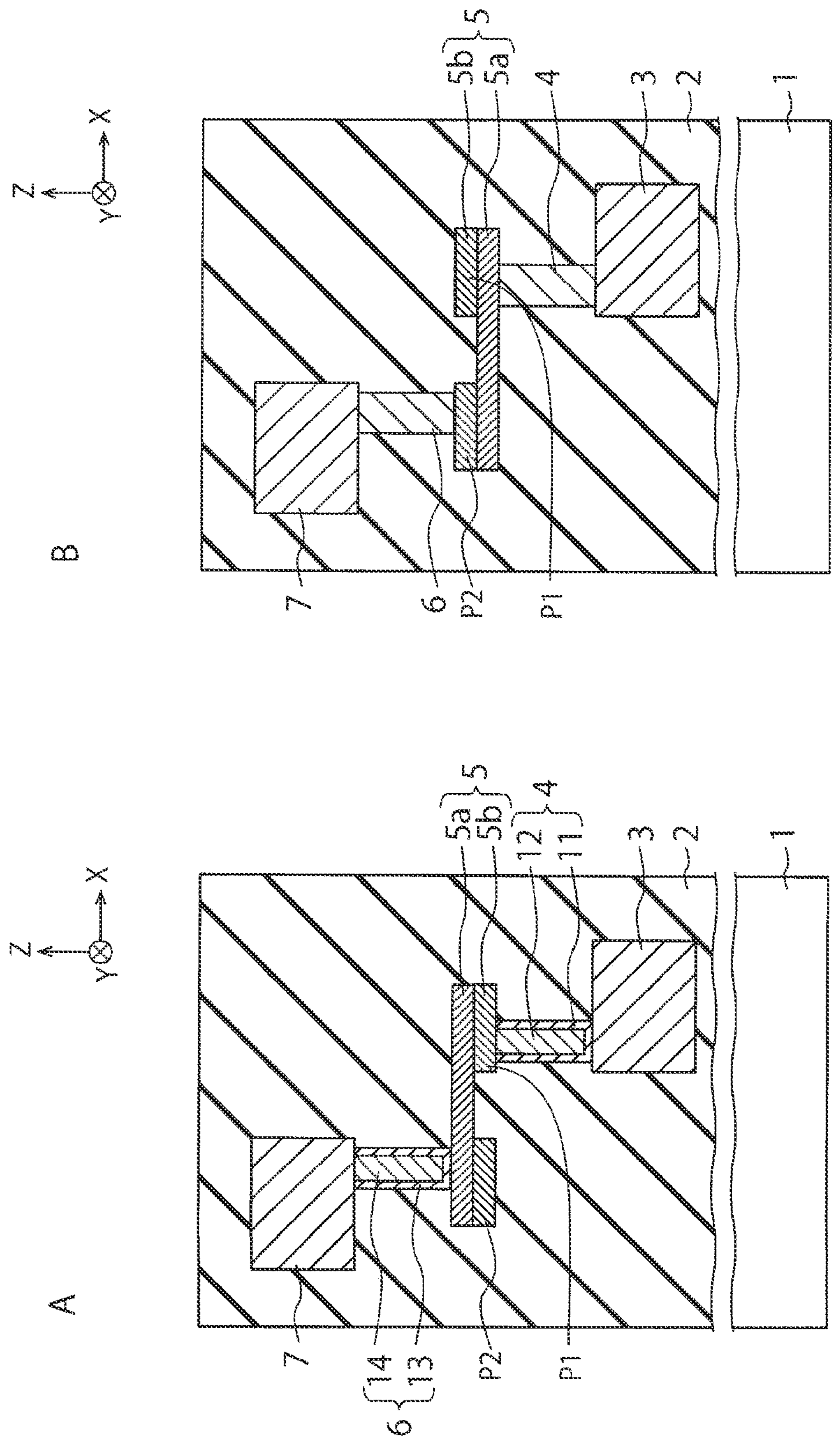
FIG. 7 is a cross-sectional view (1/2) depicting details of the structure of the semiconductor device according to the second embodiment.
Figure 8:
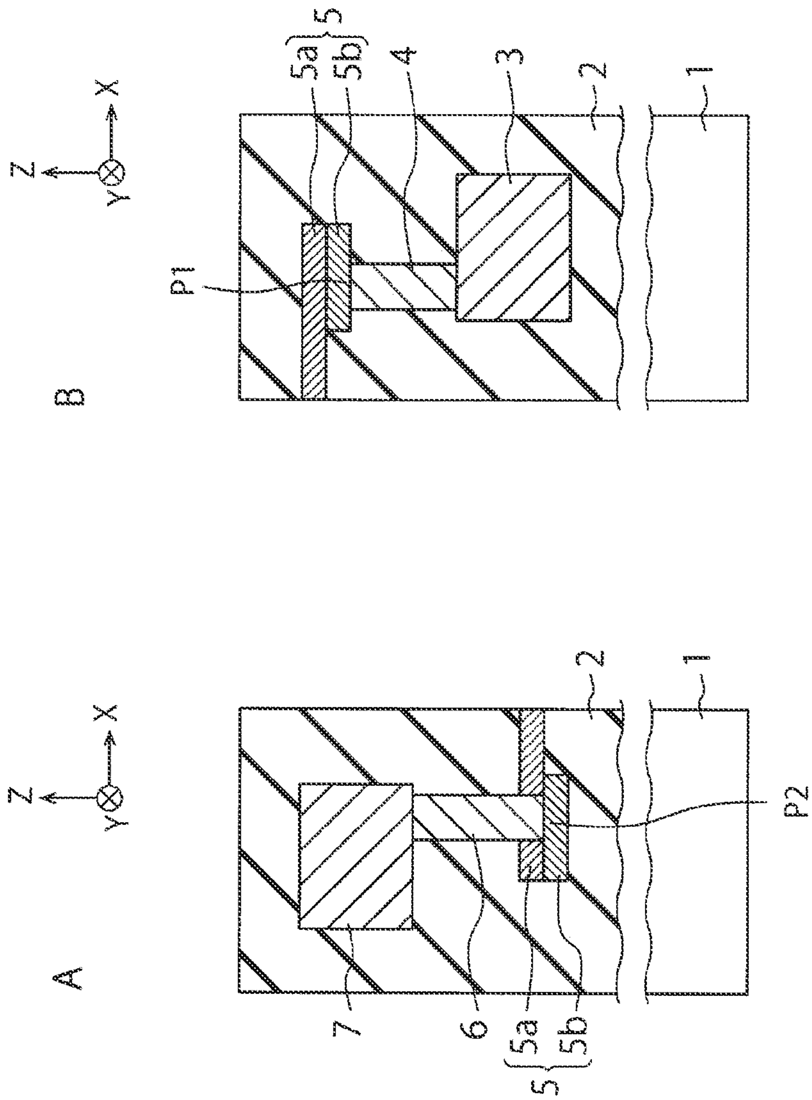
FIG. 8 is a cross-sectional view (2/2) depicting details of the structure of the semiconductor device according to the second embodiment.

FIGS. 7 and 8 are cross-sectional views depicting details of the structure of the semiconductor device according to the second embodiment.

A of FIG. 7 illustrates details of the semiconductor device illustrated in FIG. 5. As illustrated in A of FIG. 7, the plug electrode 4 includes a barrier metal layer 11 and a plug material layer 12 in this order, and the plug electrode 6 includes a barrier metal layer 13 and a plug material layer 14 in this order.

The barrier metal layer 11 is exposed on the lower surface and the side surface of the plug electrode 4 and is in contact with the wire 3. The barrier metal layer 11 is, for example, a metal layer containing Ta or Ti. The plug material layer 12 is exposed on the upper surface of the plug electrode 4 and is in contact with the resistance layer 5 (low-resistance layer 5*b*). The plug material layer 12 is, for example, a metal layer containing Al, W, or Cu.

The barrier metal layer 13 is exposed on the lower surface and the side surface of the plug electrode 6, and is in contact with the resistance layer 5 (high-resistance layer 5*a*). The barrier metal layer 13 is, for example, a metal layer containing Ta or Ti. The plug material layer 14 is exposed on the upper surface of the plug electrode 6 and is in contact with the wire 7. The plug material layer 14 is, for example, a metal layer containing Al, W, or Cu.

Note that such a structure of the plug electrodes 4 and 6 can also be applied to the plug electrodes 4 and 6 illustrated in the drawings other than A of FIG. 7.

Next, the relationship between the plug electrodes 4 and 6 and the resistance layer 5 will be described with reference to A of FIG. 7.

In A of FIG. 7, the low-resistance layer 5*b* is formed on the plug material layer 12 of the plug electrode 4, and the high-resistance layer 5*a* is formed on the low-resistance layer 5*b*. The structure described above has an advantage that oxidation (or nitriding) of the plug material layer 12 at the time of forming the high-resistance layer 5*a* can be suppressed.

Here, it is assumed that the plug material layer 12 is a W layer, the low-resistance layer 5*b* is an Al—Ni(B) layer, and the high-resistance layer 5*a* is a TaSiO layer. In this case, if the high-resistance layer 5*a* is directly formed on the plug material layer 12, the upper surface of the plug material layer 12 is oxidized at the time of forming the high-resistance layer 5*a*. As a result, the contact resistance between the plug electrode 4 and the resistance layer 5 may increase or vary. On the other hand, when the high-resistance layer 5*a* is formed on the plug material layer 12 via the low-resistance layer 5*b*, oxidation of the plug material layer 12 and oxidation of the low-resistance layer 5*b* hardly occur. The reason is that the Al—Ni(B) layer is less likely to oxidize other layers because it does not contain oxygen, and furthermore, the Al—Ni(B) layer has a property of being hardly oxidized (oxidation resistance). Therefore, according to the present embodiment, due to the formation of the high-resistance layer 5*a* on the plug material layer 12 via the low-resistance layer 5*b*, it is possible to suppress an increase and variation in contact resistance of the plug electrode 4.

On the other hand, in A of FIG. 7, the plug material layer 14 of the plug electrode 6 is formed on the high-resistance layer 5*a* without the low-resistance layer 5*b* interposed therebetween. Therefore, it seems to be also conceivable that oxidation of the plug material layer 14 occurs for the above reason. However, the plug material layer 14 is formed on the high-resistance layer 5*a* via the barrier metal layer 13. Therefore, according to the present embodiment, even if the plug material layer 14 is formed on the high-resistance layer 5*a* without the low-resistance layer 5*b* interposed therebetween, it is possible to suppress an increase or variation in contact resistance of the plug electrode 6.

Note that the effect described above can also be obtained in a case where the plug material layer 12 is other than the W layer, the low-resistance layer 5*b* is other than the Al—Ni(B) layer, or the high-resistance layer 5*a* is other than the TaSiO layer. For example, in a case where the plug material layer 12 is easily nitrided and the high-resistance layer 5*a* contains nitrogen, the low-resistance layer 5*b* may be formed to have nitriding resistance.

The semiconductor device according to the present embodiment may have a structure illustrated in B of FIG. 7 instead of the structure illustrated in A of FIG. 7. In B of FIG. 7, the high-resistance layer 5*a* is formed on the plug material layer 12 of the plug electrode 4, and the low-resistance layer 5*b* is formed on the high-resistance layer 5*a*. The structure described above is adopted, for example, in a case where the plug material layer 12 is hardly oxidized (or nitrided) or in a case where oxidation (or nitriding) of the plug material layer 12 is not problematic.

The semiconductor device according to the present embodiment may have structures illustrated in A and B of FIG. 8. The structure of the plug electrode 4 illustrated in B of FIG. 8 is the same as that in FIG. 5. On the other hand, the plug electrode 6 illustrated in A of FIG. 8 penetrates the high-resistance layer 5*a* and is in contact with the low-resistance layer 5*b*. The structure of the plug electrode 6 described above is achieved, for example, for the following reasons.

When the semiconductor device illustrated in A of FIG. 8 is manufactured, for example, the high-resistance layer 5*a* is formed on the low-resistance layer 5*b*, a part of the interlayer insulating film 2 is formed on the high-resistance layer 5*a*, a via hole reaching the high-resistance layer 5*a* is formed in the interlayer insulating film 2, and the plug electrode 6 is formed in the via hole. In this case, when it is difficult to obtain an etching selectivity between the interlayer insulating film 2 and the high-resistance layer 5*a*, the via hole penetrates the high-resistance layer 5*a* and reaches the low-resistance layer 5*b*. When the plug electrode 6 is formed in the via hole described above, the plug electrode 6 penetrates the high-resistance layer 5*a* and is in contact with the low-resistance layer 5*b*.

Here, it is assumed that the interlayer insulating film 2 is a silicon oxide film, the low-resistance layer 5*b* is an Al—Ni(B) layer, and the high-resistance layer 5*a* is a TaSiO layer. In this case, both the interlayer insulating film 2 and the high-resistance layer 5*a* are oxide films, and thus, it is difficult to obtain an etching selectivity between the interlayer insulating film 2 and the high-resistance layer 5*a*. Therefore, it is highly likely that the via hole penetrates the high-resistance layer 5*a*. On the other hand, the etching selectivity between the high-resistance layer 5*a* and the low-resistance layer 5*b* is easily obtained because the low-resistance layer 5*b* is an alloy layer containing no oxygen. Therefore, a via hole can be formed using the low-resistance layer 5*b* as an etching stopper. Thus, by forming the plug electrode 6 in the via hole described above, it is possible to form the plug electrode 6 that penetrates the high-resistance layer 5*a* and is in contact with the low-resistance layer 5*b*.

Note that, in a case where the structure illustrated in B of FIG. 7 is adopted, the low-resistance layer 5*b* is formed on the high-resistance layer 5*a*, and thus, it is possible to achieve a structure in which the via hole reaches the low-resistance layer 5*b* and does not reach the high-resistance layer 5*a*.

Figure 9:
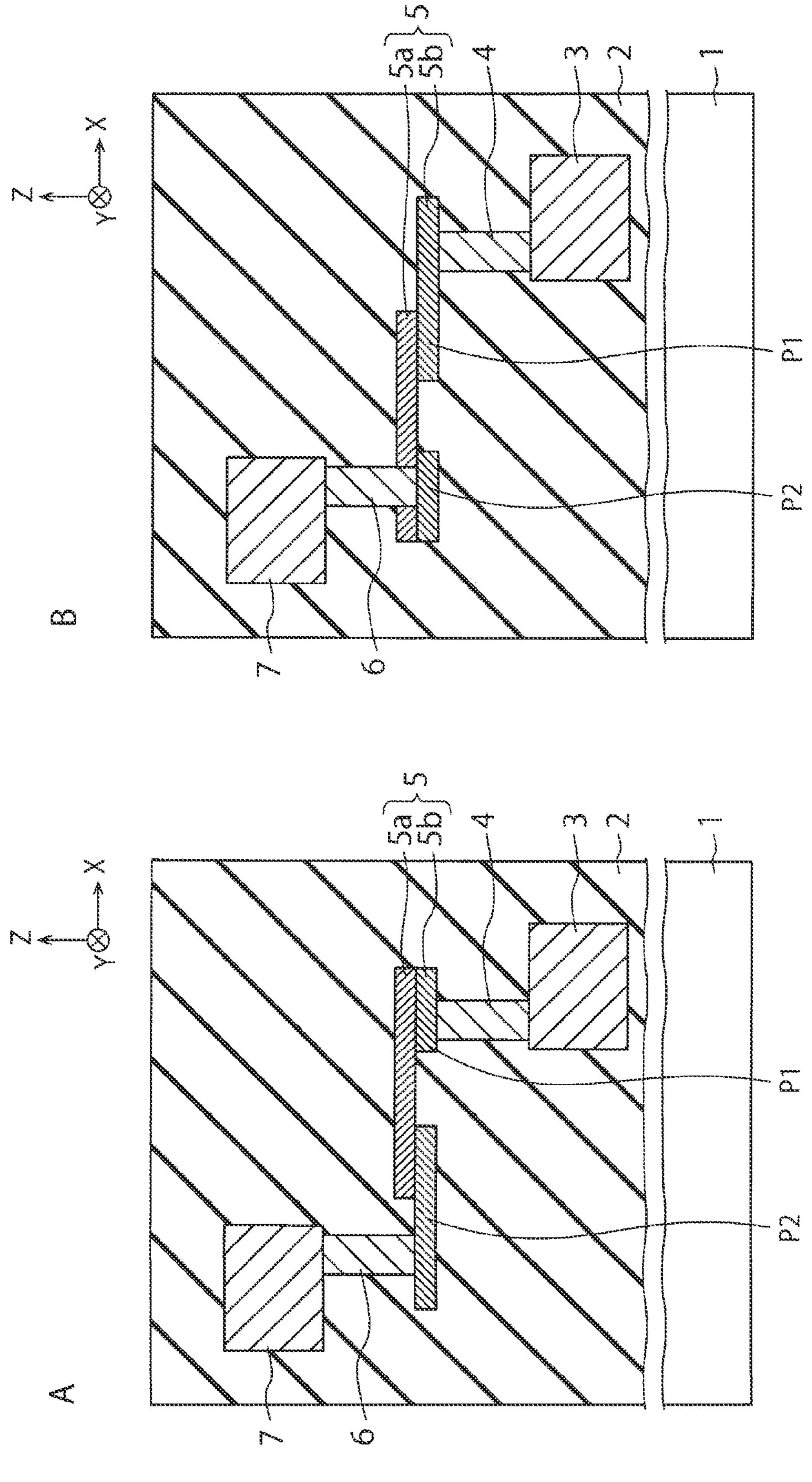
FIG. 9 is a cross-sectional view (1/2) depicting the structure of a semiconductor device according to a modification of the second embodiment.
Figure 10:
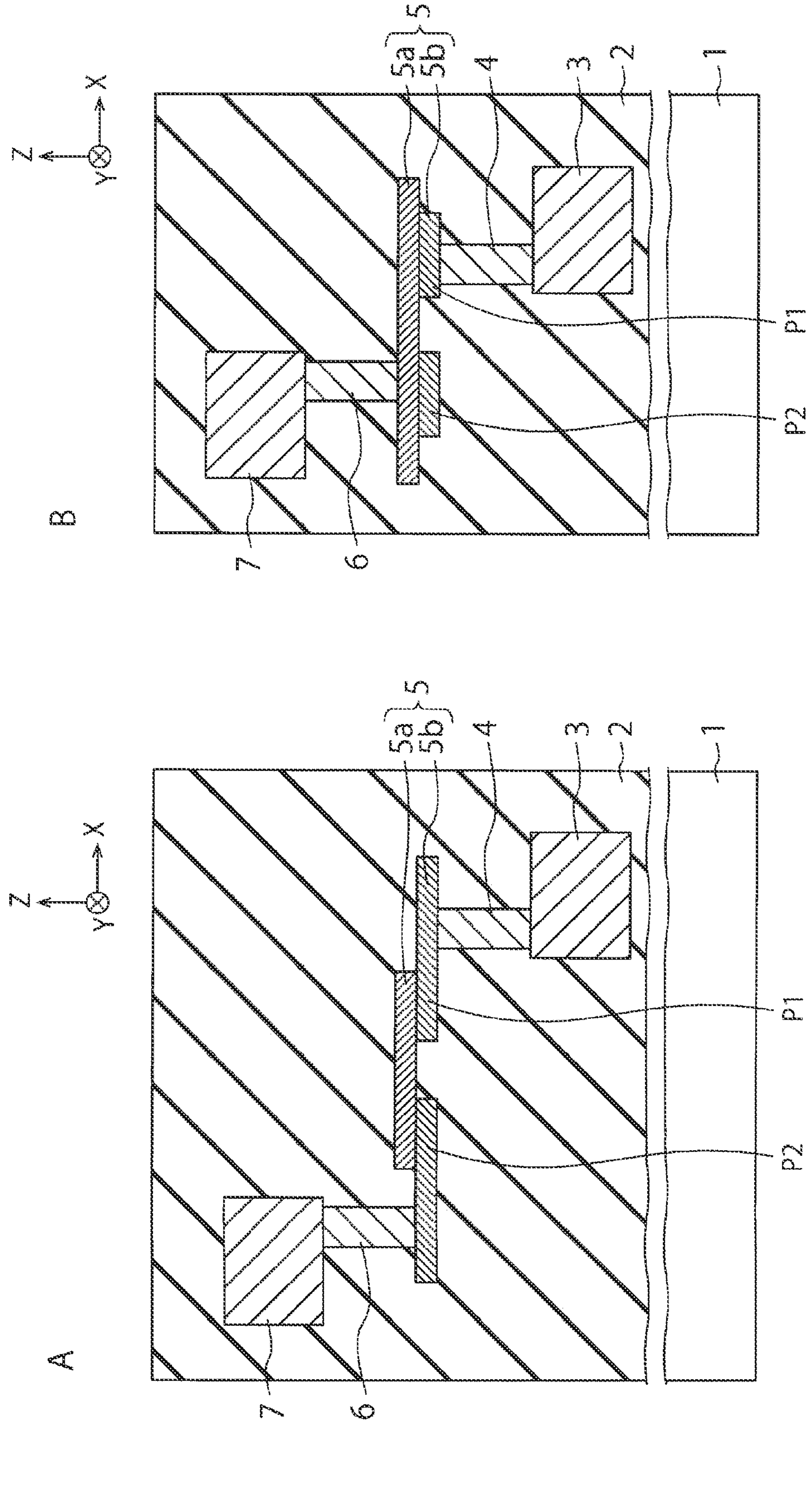
FIG. 10 is a cross-sectional view (2/2) depicting the structure of the semiconductor device according to the modification of the second embodiment.

FIGS. 9 and 10 are cross-sectional views illustrating a structure of a semiconductor device according to a modification of the second embodiment.

In A of FIG. 9, the high-resistance layer 5*a* is not formed near the plug electrode 6, and only the low-resistance layer 5*b* is formed near the plug electrode 6. In B of FIG. 9, the high-resistance layer 5*a* is not formed near the plug electrode 4, and only the low-resistance layer 5*b* is formed near the plug electrode 4.

In A of FIG. 10, the high-resistance layer 5*a* is not formed near the plug electrodes 4 and 6, and only the low-resistance layer 5*b* is formed near the plug electrodes 4 and 6. On the other hand, in B of FIG. 10, the high-resistance layer 5*a* extends to the right side (that is, the +X direction) of the first portion P1 and extends to the left side (that is, the −X direction) of the second portion P2.

The semiconductor device according to the present embodiment may have a structure shown in any one of A of FIG. 9 to B of FIG. 10. With the structures described above, it is possible to form the resistance layer 5 including the high-resistance layer 5*a* and the low-resistance layer 5*b* while satisfying various layout constraints.

As described above, the resistance layer 5 in the present embodiment includes the high-resistance layer 5*a* and the low-resistance layer 5*b*, and the low-resistance layer 5*b* is divided into the first portion P1 and the second portion P2. Therefore, according to the present embodiment, the value of the electric resistance of the resistance layer 5 can be adjusted with high accuracy.

Third Embodiment

Figure 11:
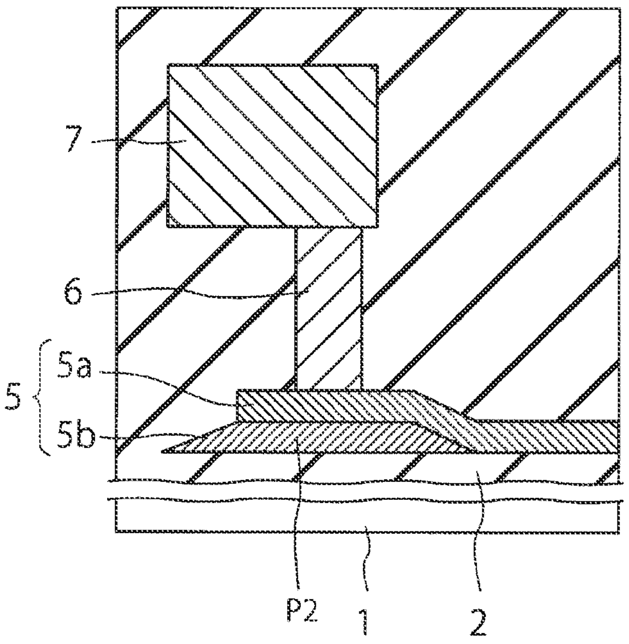
FIG. 11 is a cross-sectional view depicting a structure of a semiconductor device according to a third embodiment.

FIG. 11 is a cross-sectional view depicting a structure of a semiconductor device according to the third embodiment.

Similar to the semiconductor device illustrated in FIG. 5, the semiconductor device according to the present embodiment includes a substrate 1, an interlayer insulating film 2, a wire 3 (not illustrated), a plug electrode 4 (not illustrated), a resistance layer 5, a plug electrode 6, and a wire 7. In addition, the resistance layer 5 in the present embodiment includes a high-resistance layer 5*a* and a low-resistance layer 5*b* similarly to the resistance layer 5 illustrated in FIG. 5.

However, the low-resistance layer 5*b* in the present embodiment has a side surface having a tapered shape (inclined). Furthermore, the high-resistance layer 5*a* in the present embodiment is in contact with the upper surface and the tapered side surface of the low-resistance layer 5*b*. The low-resistance layer 5*b* described above can be formed, for example, by wet etching when the low-resistance layer 5*b* is etched.

Figure 12:
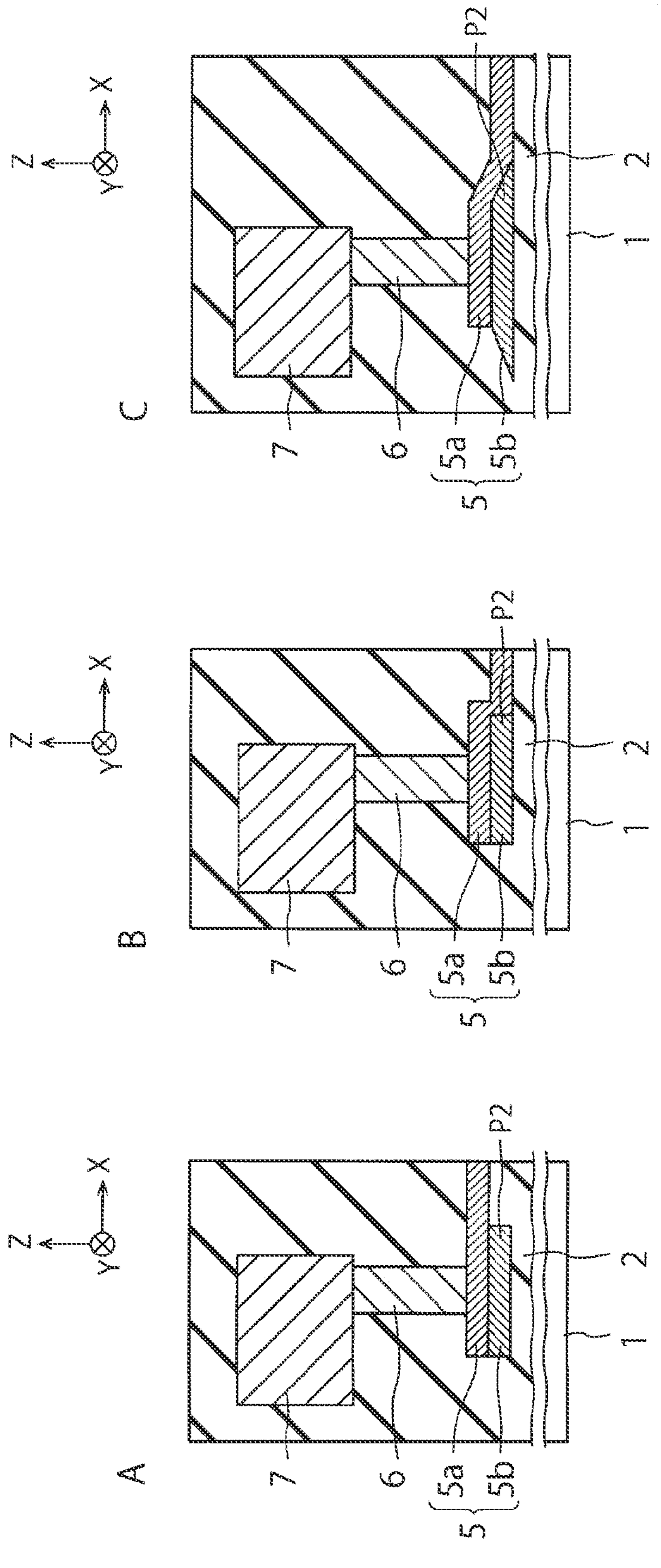
FIG. 12 is a cross-sectional view for describing the structure of the semiconductor device according to the third embodiment.

FIG. 12 is a cross-sectional view for describing the structure of the semiconductor device according to the third embodiment.

A of FIG. 12 illustrates the resistance layer 5 in the second embodiment (FIG. 5). The high-resistance layer 5*a* illustrated in A of FIG. 12 is in contact with only the upper surface of the low-resistance layer 5*b*.

B of FIG. 12 illustrates the resistance layer 5 in the modification of the second embodiment (FIG. 5). The high-resistance layer 5*a* illustrated in B of FIG. 12 has a step near the side surface of the low-resistance layer 5*b*, and is in contact with the upper surface and the side surface of the low-resistance layer 5*b*. In this case, the high-resistance layer 5*a* is likely to be broken at the position of the step of the high-resistance layer 5*a*, which is a problem.

C of FIG. 12 illustrates the resistance layer 5 in the present embodiment (FIG. 11). The high-resistance layer 5*a* illustrated in C of FIG. 12 also has a step near the side surface of the low-resistance layer 5*b*, and is in contact with the upper surface and the side surface of the low-resistance layer 5*b*. However, the low-resistance layer 5*b* in the present embodiment has a side surface having a tapered shape (inclined). With this configuration, the break of the high-resistance layer 5*a* at the position of the step of the high-resistance layer 5*a* can be prevented.

Note that the taper angle of the side surface of the low-resistance layer 5*b* is desirably set to, for example, 30° to 85° C. The taper angle is an angle of the side surface of the low-resistance layer 5*b* with respect to the −Z direction.

Fourth Embodiment

Figure 13:
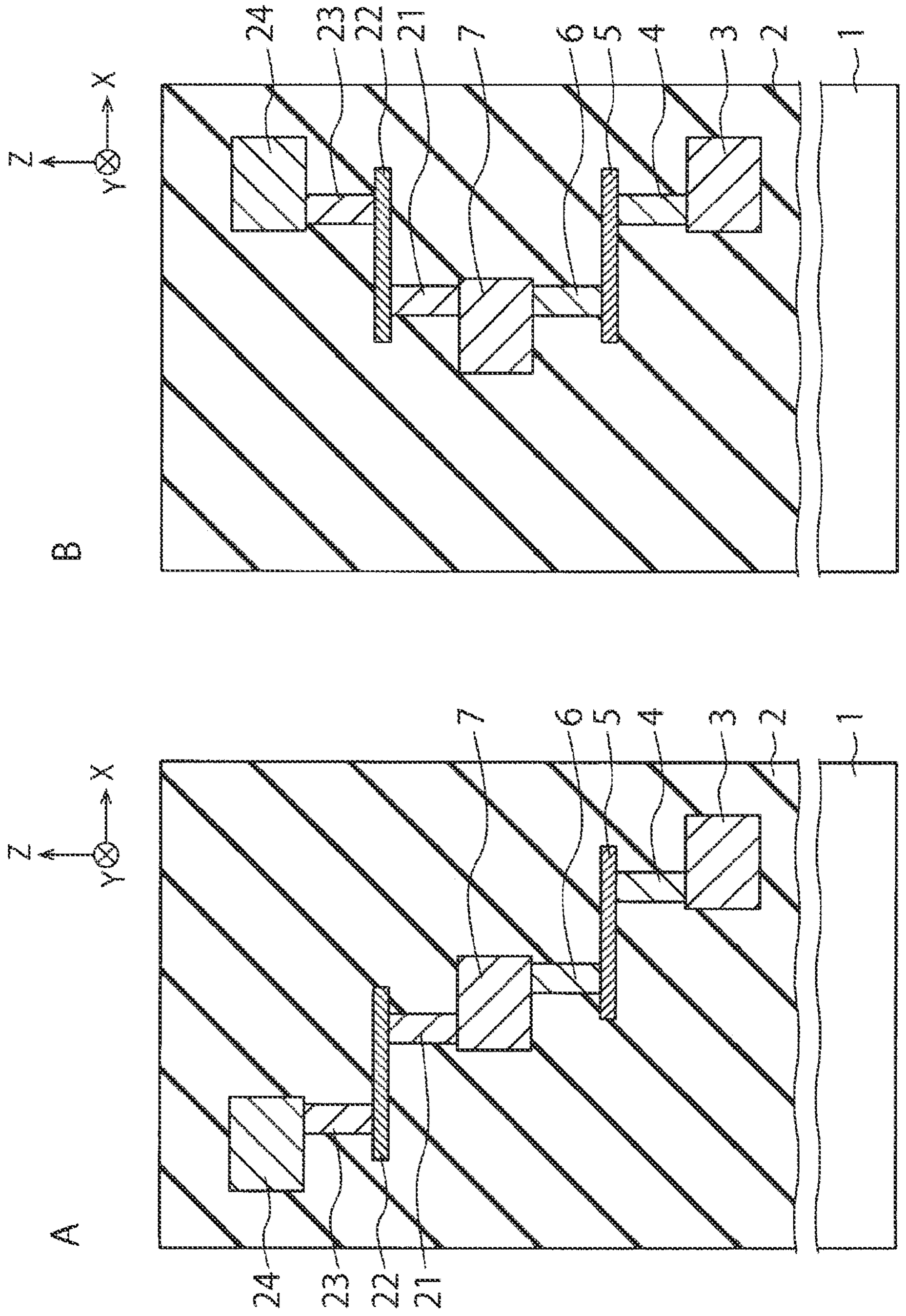
FIG. 13 is a cross-sectional view depicting a structure of a semiconductor device according to a fourth embodiment.

FIG. 13 is a cross-sectional view depicting a structure of a semiconductor device according to the fourth embodiment.

A of FIG. 13 illustrates a first example of the semiconductor device according to the present embodiment. The semiconductor device illustrated in A of FIG. 13 includes a plug electrode 21, a resistance layer 22, a plug electrode 23, and a wire 24 in addition to the components illustrated in FIG. 1. The plug electrode 21 is an example of a third electrode in the present disclosure. The resistance layer 22 is an example of a second resistance layer in the present disclosure. The plug electrode 23 is an example of a fourth electrode in the present disclosure. The wire 24 is an example of a third wire in the present disclosure.

The plug electrode 21 is formed on the wire 7 and is electrically connected to the wire 7. The lower surface of the plug electrode 21 is in contact with the upper surface of the wire 7. The plug electrode 21 is, for example, a metal layer including an Al layer, a W layer, or a Cu layer. The plug electrode 21 is, for example, a via plug.

The resistance layer 22 is formed on the plug electrode 21 and is electrically connected to the plug electrode 21. The lower surface of the resistance layer 22 is in contact with the upper surface of the plug electrode 21. The resistance layer 22 is, for example, an oxide film, a nitride film, or an oxynitride film containing a metal element. Examples of the metal element include high melting point metal elements such as a Ta (tantalum) element and a Ti (titanium) element. The resistance layer 22 may further contain a Si element. Examples of the resistance layer 22 described above include a cermet layer such as a TaSiO layer or a TiSiO layer.

The plug electrode 23 is formed on the resistance layer 22 and is electrically connected to the resistance layer 22. The lower surface of the plug electrode 23 is in contact with the upper surface of the resistance layer 22. The plug electrode 23 is, for example, a metal layer including an Al layer, a W layer, or a Cu layer. The plug electrode 23 is, for example, a via plug.

The wire 24 is provided in one wiring layer formed above the substrate 1, and is included in a wiring layer different from the wiring layer including the wire 7. Therefore, the resistance layer 22 is disposed between these wiring layers. The wire 24 is formed on the plug electrode 23 and is electrically connected to the plug electrode 23. The lower surface of the wire 24 is in contact with the upper surface of the plug electrode 23. The wire 24 is, for example, a metal layer including an Al layer, a W layer, or a Cu layer.

The present embodiment can achieve multilayering of the resistance layer by forming the resistance layer 5 and the resistance layer 22 above the substrate 1. The resistance layers 5 and 22 are connected in series via the wire 7 and the like. Note that the resistance layers 5 and 22 may be connected in parallel via the wire 7 and the like.

In addition, the plug electrodes 21 and 23 in the present embodiment are disposed so as to be in contact with different surfaces of the resistance layer 22. Therefore, according to the present embodiment, the distance between the plug electrodes 21 and 23 can be increased, and the parasitic capacitance between the plug electrodes 22 and 23 can be reduced.

Note that, similar to the resistance layer 5 in the second embodiment, the resistance layer 22 in the present embodiment may include a high-resistance layer and a low-resistance layer. In this case, the low-resistance layer may have a side surface having a tapered shape like the low-resistance layer 5*b* in the third embodiment. Further, the high-resistance layer may be in contact with the upper surface of the low-resistance layer and the tapered side surface like the high-resistance layer 5*a* in the third embodiment.

B of FIG. 13 illustrates a second example of the semiconductor device according to the present embodiment. The semiconductor device illustrated in B of FIG. 13 includes the same components as those of the semiconductor device illustrated in A of FIG. 13. However, the plug electrode 23 is positioned not in the −X direction but in the +X direction of the plug electrode 21, and is positioned substantially directly above the plug electrode 4. Similarly, the plug electrode 21 is also located substantially directly above the plug electrode 6. With this configuration, the footprint of these components can be reduced, and the chip area of the semiconductor device can be reduced.

Figure 14:
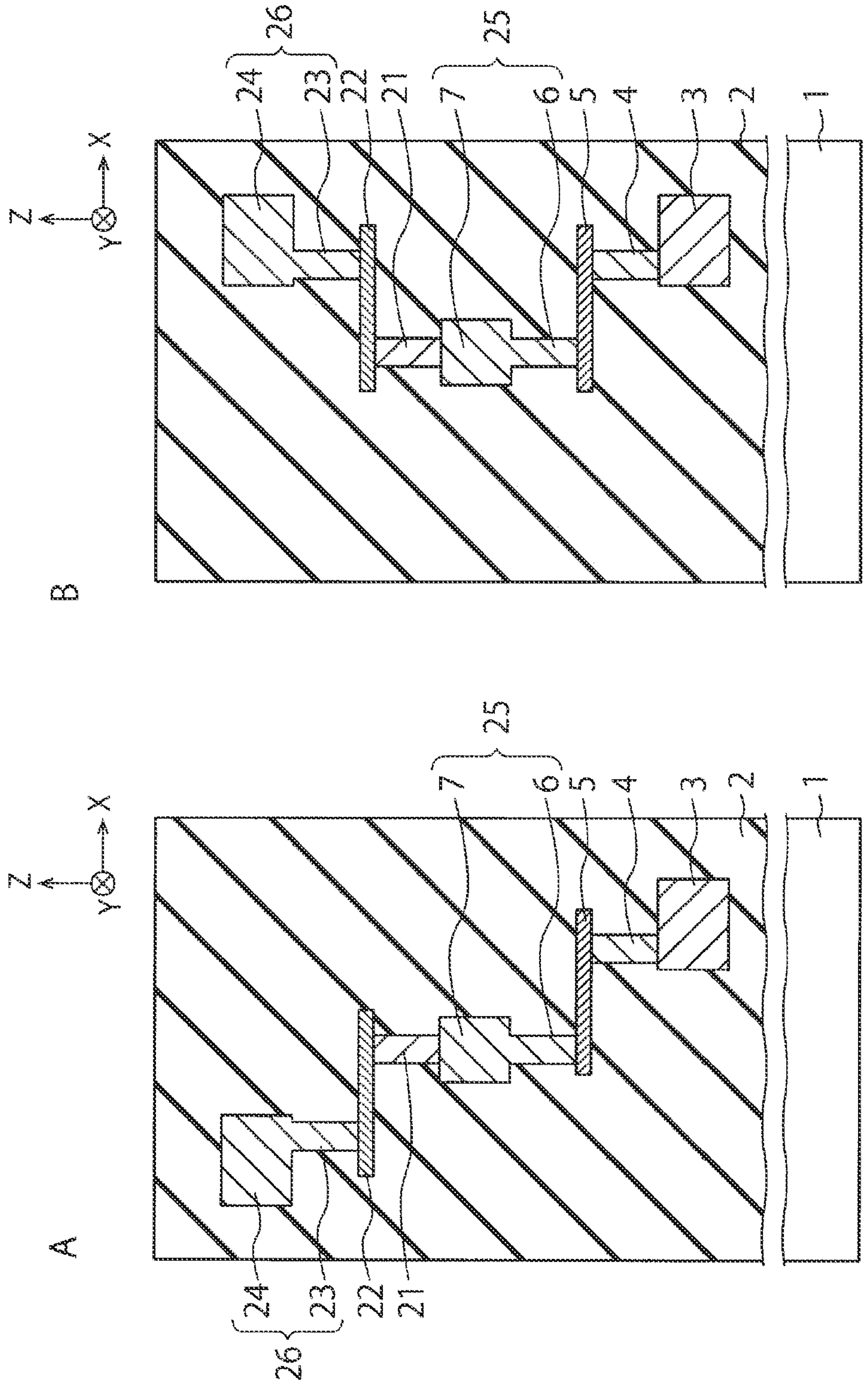
FIG. 14 is a cross-sectional view depicting a structure of a semiconductor device according to a modification of the fourth embodiment.

FIG. 14 is a cross-sectional view depicting a structure of a semiconductor device according to a modification of the fourth embodiment.

A of FIG. 14 illustrates a first example of the semiconductor device according to the present modification. This semiconductor device has a structure similar to that of the semiconductor device illustrated in A of FIG. 13. However, the plug electrode 6 and the wire 7 in this example form a dual damascene wire 25. The dual damascene wire 25 is, for example, a metal layer including a Cu layer. Similarly, the plug electrode 23 and the wire 24 in this example form a dual damascene wire 26. The dual damascene wire 26 is, for example, a metal layer including a Cu layer.

B of FIG. 14 illustrates a second example of the semiconductor device according to the present modification. This semiconductor device has a structure similar to that of the semiconductor device illustrated in B of FIG. 13. However, the plug electrode 6 and the wire 7 in this example also form a dual damascene wire 25. Similarly, the plug electrode 23 and the wire 24 in this example also form a dual damascene wire 26.

According to these examples, the plug electrode 6 and the wire 7 are formed as the dual damascene wire 25, and the plug electrode 23 and the wire 24 are formed as the dual damascene wire 26, whereby it is possible to form these electrodes and wires with a small number of steps.

Fifth Embodiment

FIGS. 15 to 19 are cross-sectional views illustrating a method for manufacturing a semiconductor device according to the fifth embodiment. According to this method, the semiconductor device according to the second embodiment can be manufactured.

Figure 15:
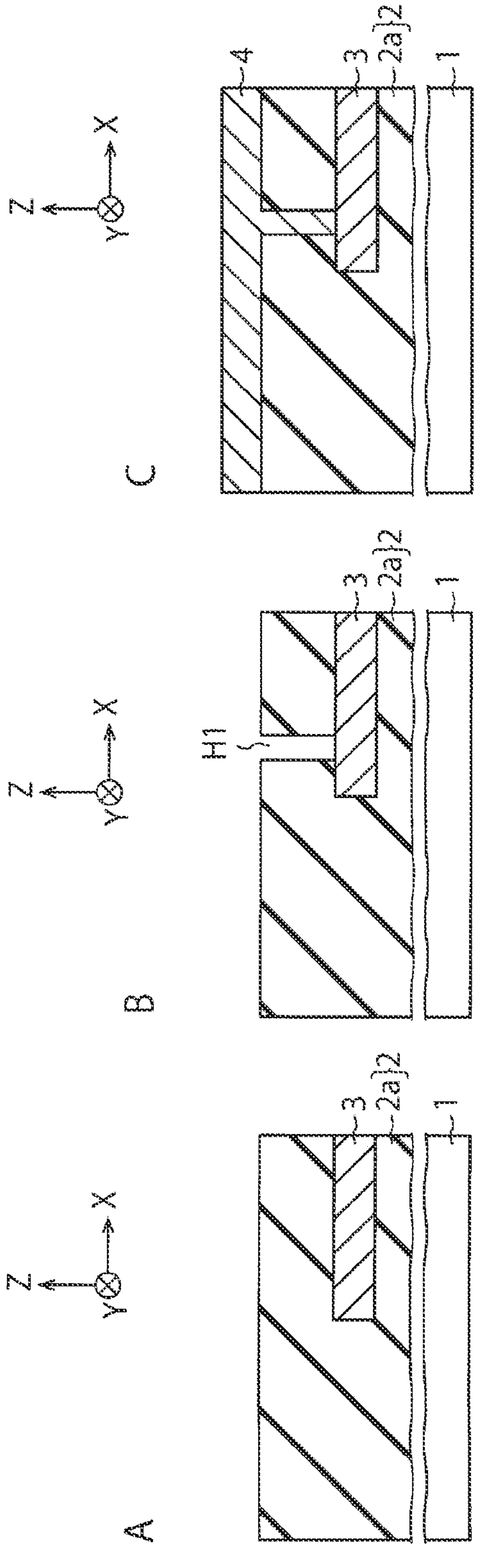
FIG. 15 is a cross-sectional view (1/5) depicting a method for manufacturing a semiconductor device according to the fifth embodiment.

First, an interlayer insulating film 2*a* as a part of the interlayer insulating film 2 and a wiring layer including the wire 3 are formed on the substrate 1 (A of FIG. 15). In the step illustrated in A of FIG. 15, the lower portion of the interlayer insulating film 2*a* is formed on the substrate 1, the wire 3 is formed on the lower portion of the interlayer insulating film 2*a*, and the upper portion of the interlayer insulating film 2*a* is formed on the lower portion of the interlayer insulating film 2*a* so as to cover the wire 3.

Next, a via hole H1 reaching the wire 3 is formed in the interlayer insulating film 2*a* by photolithography and dry etching (B of FIG. 15). Next, a material of the plug electrode 4 is formed on the entire surface of the substrate 1 by chemical vapor deposition (CVD) (C of FIG. 15). Next, the material outside the via hole H1 is removed by etch-back or chemical mechanical polishing (CMP) (A of FIG. 16). As a result, the plug electrode 4 is formed on the wire 3 in the via hole H1. The lower surface of the plug electrode 4 is in contact with the upper surface of the wire 3.

Figure 16:
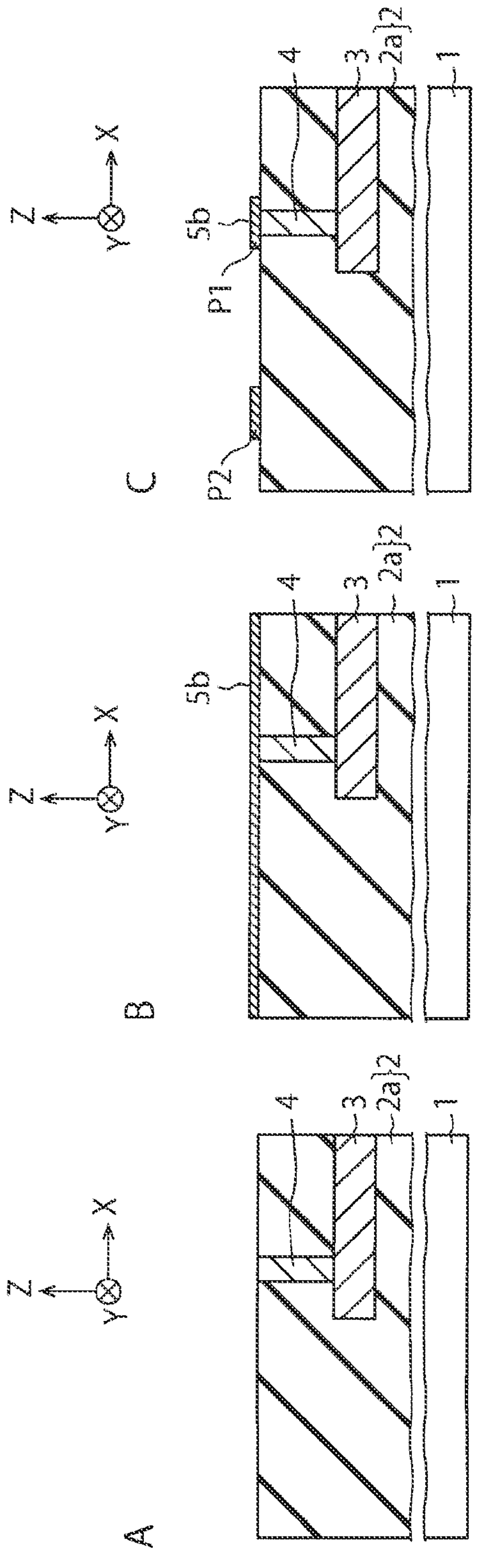
FIG. 16 is a cross-sectional view (2/5) depicting the method for manufacturing a semiconductor device according to the fifth embodiment.

Next, a material of the low-resistance layer 5*b* is formed on the interlayer insulating film 2*a* and the plug electrode 4 by sputtering (B of FIG. 16). Next, the shape of the material is processed by photolithography and dry etching (C of FIG. 16). As a result, the low-resistance layer 5*b* including the first portion P1 and the second portion P2 separated from each other is formed. The second portion P2 is formed on the plug electrode 4. The lower surface of the second portion P2 is in contact with the upper surface of the plug electrode 4.

Figure 17:
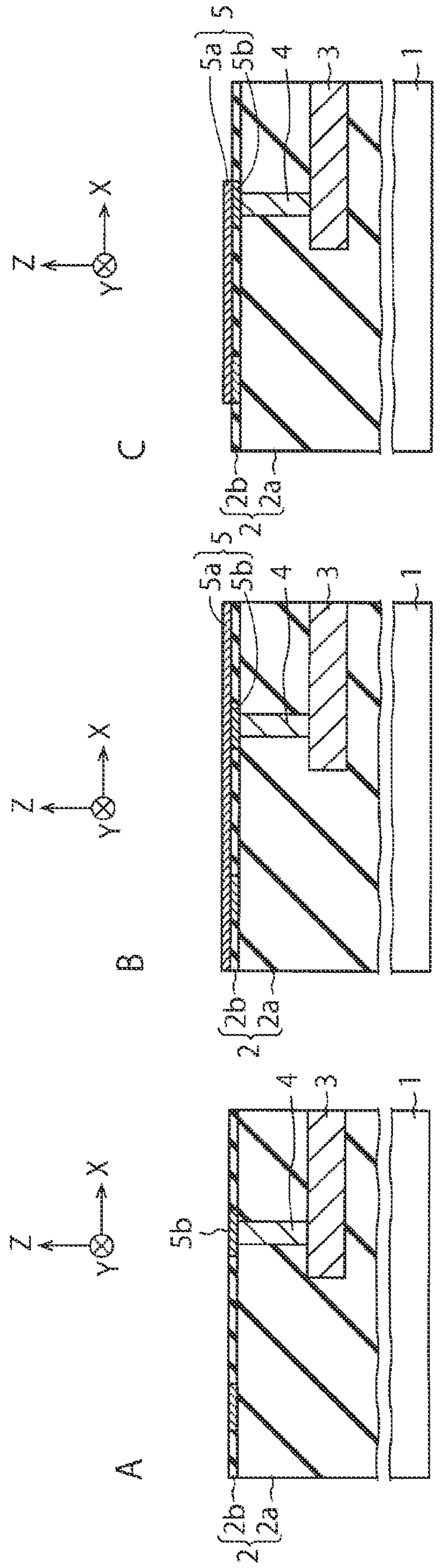
FIG. 17 is a cross-sectional view (3/5) depicting the method for manufacturing a semiconductor device according to the fifth embodiment.

Next, an interlayer insulating film 2*b* as a part of the interlayer insulating film 2 is formed on the interlayer insulating film 2*a* and the low-resistance layer 5*b*, and the upper surface of the interlayer insulating film 2*b* is polished by CMP (A of FIG. 17). As a result, the upper surface of the low-resistance layer 5*b* is exposed from the interlayer insulating film 2*b*.

Next, a material of the high-resistance layer 5*a* is formed on the interlayer insulating film 2*b* and the low-resistance layer 5*b* by sputtering (B of FIG. 17). Next, the shape of the material is processed by photolithography and dry etching (C of FIG. 17). As a result, the high-resistance layer 5*a* is formed on the first and second portions P1 and P2 of the low-resistance layer 5*b*. The lower surface of the high-resistance layer 5*a* is in contact with the upper surface of the first portion P1 and the upper surface of the second portion P2. In this way, the resistance layer 5 including the high-resistance layer 5*a* and the low-resistance layer 5*b* is formed.

Figure 18:
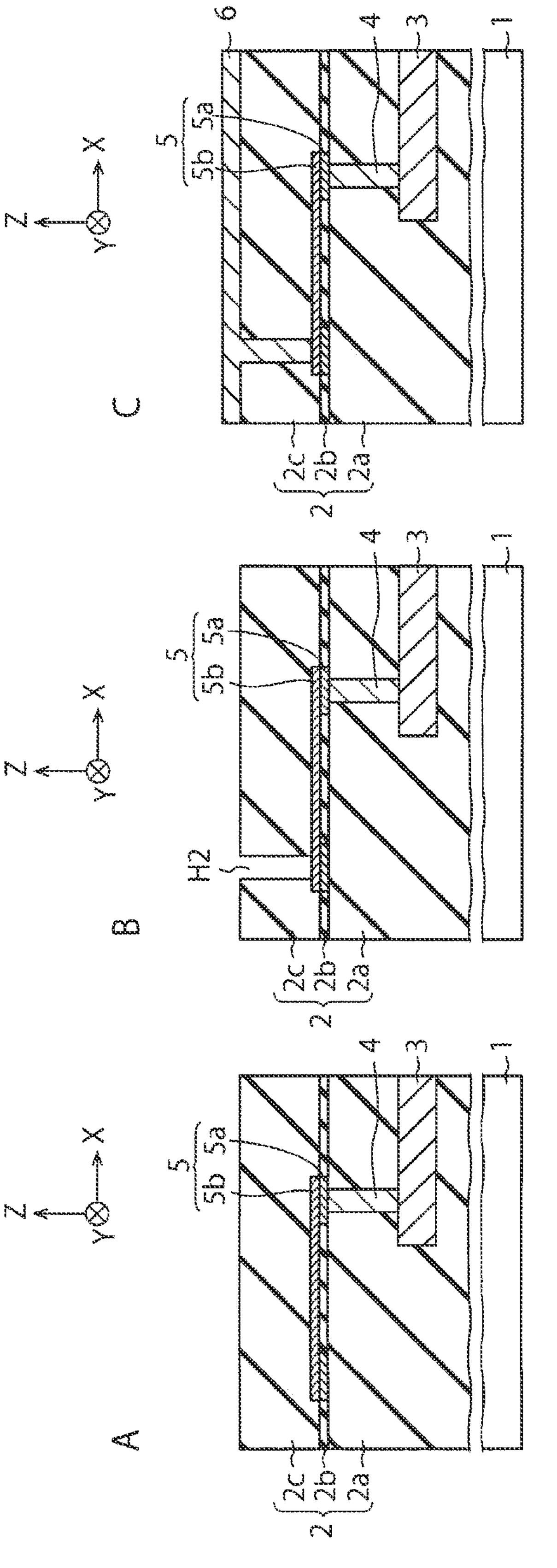
FIG. 18 is a cross-sectional view (4/5) depicting the method for manufacturing a semiconductor device according to the fifth embodiment.
Figure 19:
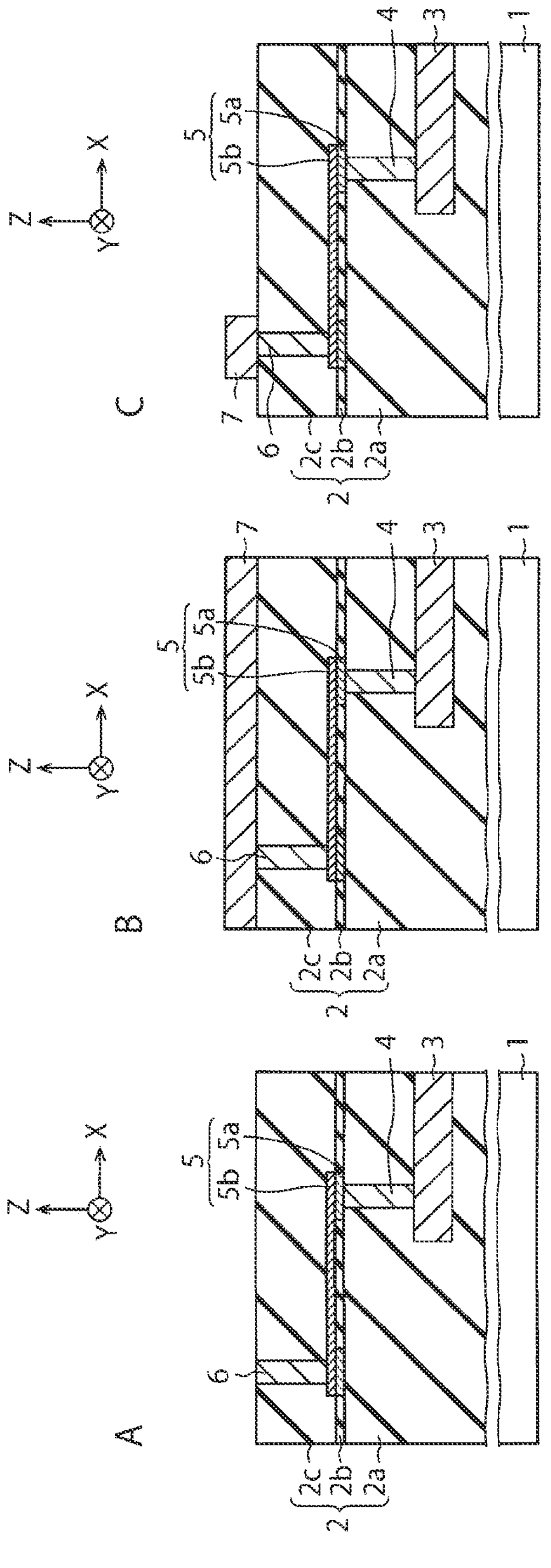
FIG. 19 is a cross-sectional view (5/5) depicting the method for manufacturing a semiconductor device according to the fifth embodiment.

Next, an interlayer insulating film 2*c* which is a part of the interlayer insulating film 2 is formed on the interlayer insulating film 2*b* and the resistance layer 5 (A of FIG. 18).

Next, a via hole H2 reaching the resistance layer 5 is formed in the interlayer insulating film 2*c* by photolithography and dry etching (B of FIG. 18). The via hole H2 is formed directly above the second portion P2. Next, a material of the plug electrode 6 is formed on the entire surface of the substrate 1 by CVD (C of FIG. 18). Next, the material outside the via hole H2 is removed by etch-back or CMP (A of FIG. 19). As a result, the plug electrode 6 is formed on the resistance layer 5 in the via hole H2. The lower surface of the plug electrode 6 is in contact with the upper surface of the resistance layer 5.

Next, a material of the wiring layer including the wire 7 is formed on the interlayer insulating film 2*c* and the plug electrode 6 by sputtering (B of FIG. 18). Next, the shape of the material is processed by photolithography and dry etching (C of FIG. 18). As a result, a wiring layer including the wire 7 is formed. The wire 7 is formed on the plug electrode 6. The lower surface of the wire 7 is in contact with the upper surface of the plug electrode 6.

Thereafter, various interlayer insulating films, resistance layers, plug electrodes, wires (wiring layers), and the like are formed on the substrate 1. In this way, the semiconductor device according to the second embodiment is manufactured.

Note that, according to the method of the present embodiment, the semiconductor device according to the first embodiment can also be manufactured. In this case, the steps illustrated in B of FIG. 16 to A of FIG. 17 are skipped.

Further, according to the method of the present embodiment, the semiconductor device according to the third embodiment can also be manufactured. In this case, the low-resistance layer 5*b* is processed by wet etching in the step illustrated in C of FIG. 16.

In addition, according to the method of the present embodiment, the semiconductor device according to the fourth embodiment can also be manufactured. In this case, after the step illustrated in C of FIG. 18, the plug electrode 21, the resistance layer 22, the plug electrode 23, and the wire 24 are formed by the similar method to that for the plug electrode 4, the resistance layer 5, the plug electrode 6, and the wire 7, respectively.

Figure 20:
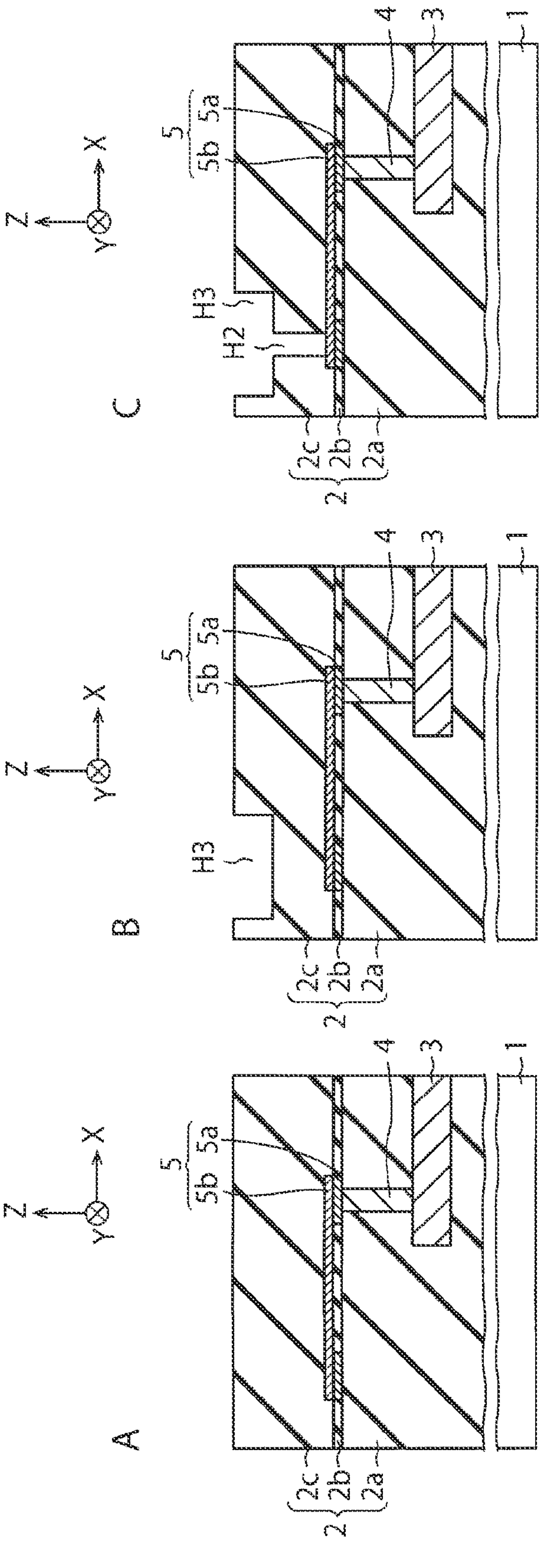
FIG. 20 is a cross-sectional view (1/2) depicting a method for manufacturing a semiconductor device according to a modification of the fifth embodiment.
Figure 21:
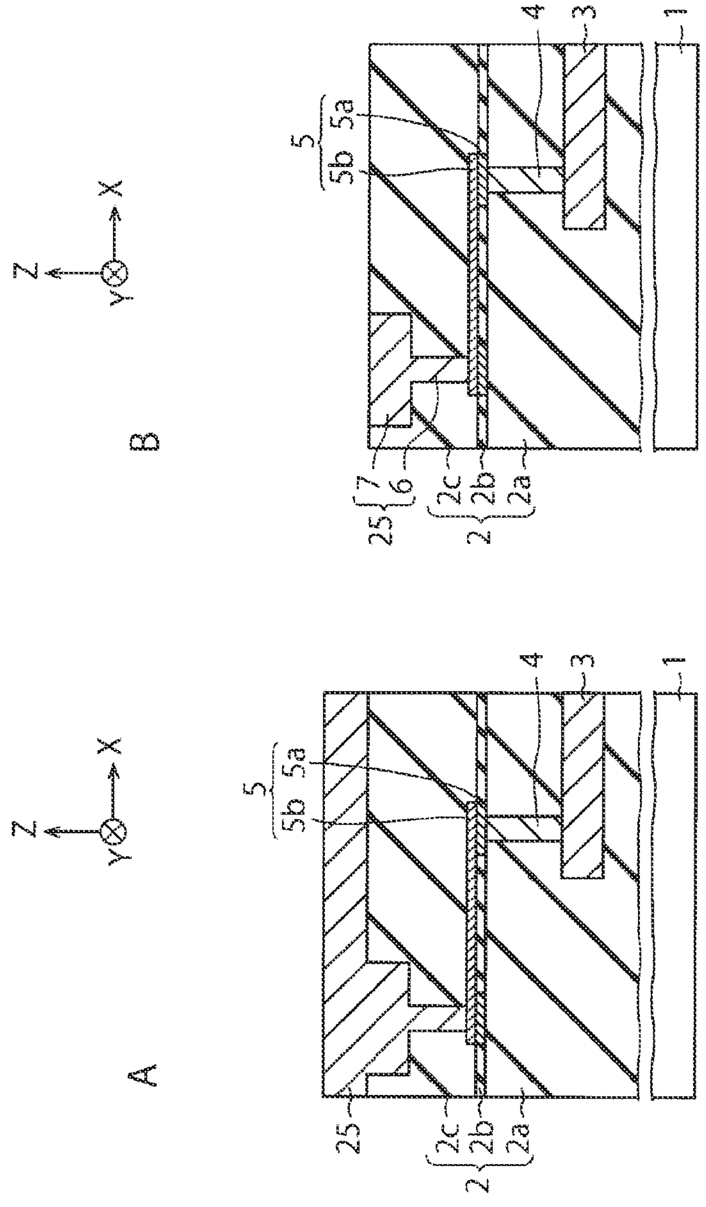
FIG. 21 is a cross-sectional view (2/2) depicting the method for manufacturing a semiconductor device according to the modification of the fifth embodiment.

FIGS. 20 and 21 are cross-sectional views illustrating a method for manufacturing a semiconductor device according to a modification of the fifth embodiment. According to this method, the plug electrode 6 and the wire 7 can be formed as the dual damascene wire 25.

A of FIG. 20 illustrates the same step as that of A of FIG. 18. In this method, first, the steps illustrated in A of FIG. 15 to A of FIG. 18 are performed.

Next, a wiring groove H3 is formed in the interlayer insulating film 2*c* by photolithography and dry etching (B of FIG. 20). Next, a via hole H2 reaching the resistance layer 5 is formed in the interlayer insulating film 2*c* under the wiring groove H3 by photolithography and dry etching (C of FIG. 20). The via hole H2 is formed directly above the second portion P2.

Next, materials of the plug electrode 6 and the wire 7 are formed on the entire surface of the substrate 1 by CVD (A of FIG. 21). Next, the material outside the via hole H2 and the wiring groove H3 is removed by etch-back or CMP (B of FIG. 21). As a result, the plug electrode 6 is formed on the resistance layer 5 in the via hole H2, and the wire 7 is formed on the plug electrode 6 in the wiring groove H3. That is, the dual damascene wire 25 is formed in the via hole H2 and the wiring groove H3. The lower surface of the dual damascene wire 25 is in contact with the upper surface of the resistance layer 5.

Note that the dual damascene wire 26 described above can also be formed by a method similar to that for the dual damascene wire 25.

As described above, according to the method of the present embodiment, the semiconductor devices according to the first to fourth embodiments can be manufactured.

Sixth Embodiment

Figure 22:
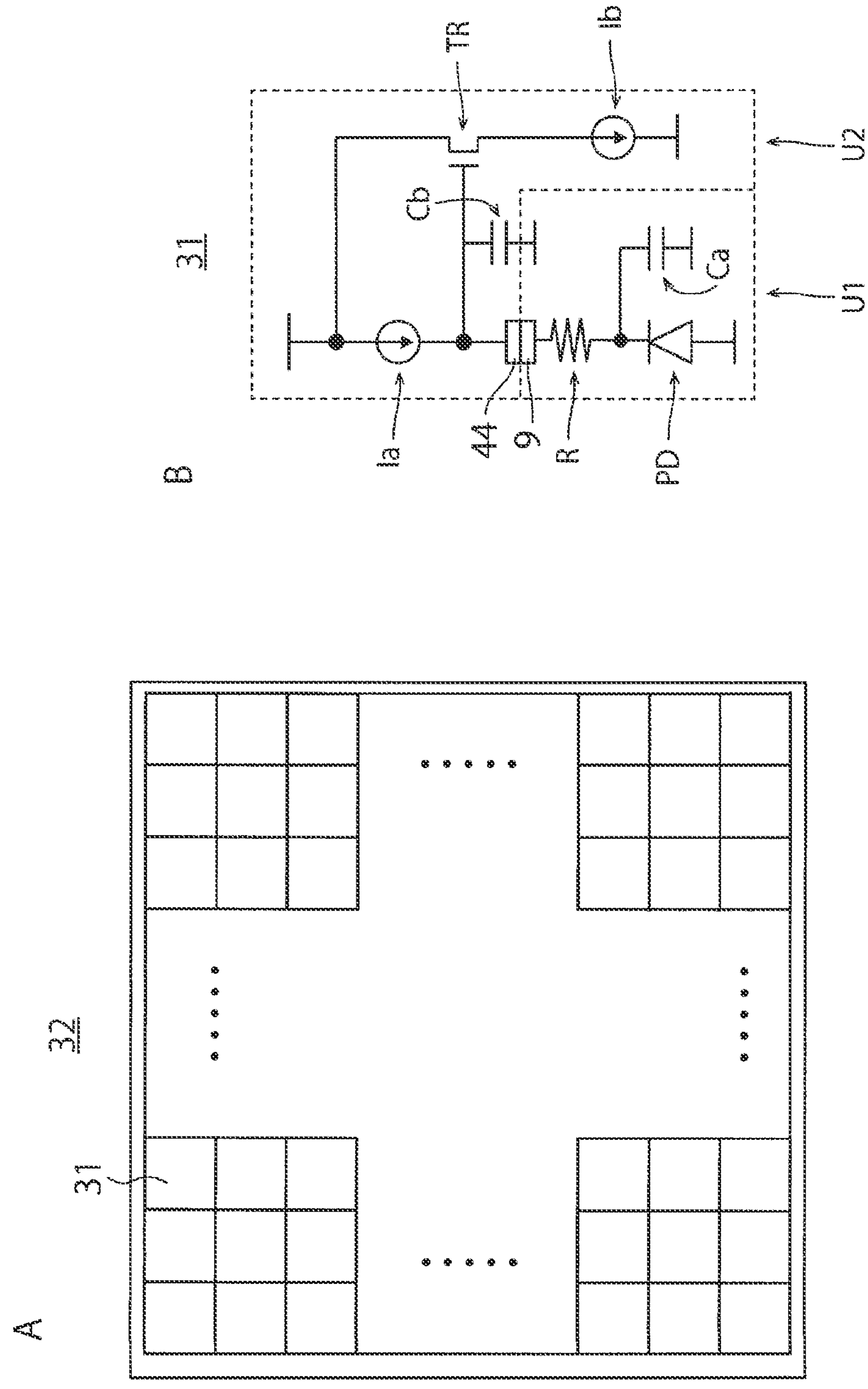
FIG. 22 is a schematic diagram and a circuit diagram depicting a configuration of a semiconductor device according to a sixth embodiment.

FIG. 22 is a schematic diagram and a circuit diagram depicting a configuration of a semiconductor device according to the sixth embodiment. The semiconductor device according to the present embodiment is a solid-state imaging device having the structure of the semiconductor device according to any one of the first to fourth embodiments.

As illustrated in A of FIG. 22, the semiconductor device (solid-state imaging device) according to the present embodiment includes a pixel array region 32 including a plurality of pixels 31 arranged in a two-dimensional array. Each of these pixels 31 has, for example, a circuit configuration illustrated in B of FIG. 22.

B of FIG. 22 illustrates one pixel 31 included in the pixel array region 32. The pixel 31 includes a first area U1 including a metal pad 9 to be described later and a second area U2 including a metal pad 44 to be described later. The first area U1 and the second area U2 are electrically connected via these metal pads 9 and 44. The semiconductor device according to the present embodiment is manufactured by bonding a first wafer and a second wafer. The first area U1 is a portion originated from the first wafer, and the second area U2 is a portion originated from the second wafer.

The pixel 31 illustrated in B of FIG. 22 includes a photoelectric conversion element (photoelectric conversion unit) PD, an electric resistance R, and a capacitor Ca in the first area U1, and includes a capacitor Cb, a transistor TR, and current sources Ia and Ib in the second area U2.

The photoelectric conversion element PD is, for example, a photodiode such as a single photon avalanche diode (SPAD), and converts incident light into a charge. The SPAD is known as a highly sensitive optical sensor element capable of detecting even one photon. According to the present embodiment, it is possible to achieve a highly sensitive optical sensor by using the SPAD as the photoelectric conversion element PD. An anode of the photoelectric conversion element PD is connected to a ground potential, and a cathode of the photoelectric conversion element PD is connected to the electric resistance R and the capacitor Ca. The photoelectric conversion element PD in the present embodiment is provided in the above-described substrate 1 as described later.

The electric resistance R is implemented by the above-described resistance layer 5, for example, and corresponds to the electric resistance R3 illustrated in A of FIG. 4 or the electric resistance R4 illustrated in B of FIG. 4. One end of the electric resistance R is connected to the photoelectric conversion element PD and the capacitor Ca, and the other end of the electric resistance R is connected to the metal pad 9. Further, one electrode of the capacitor Ca is connected to the photoelectric conversion element PD and the electric resistance R, and the other electrode of the capacitor Ca is connected to the ground potential.

Note that the electric resistance R may be achieved by the resistance layer 5 and the resistance layer 22 described above. In this case, the value of the electric resistance R is a resistance value obtained by series connection (or parallel connection) of the resistance layer 5 and the resistance layer 22.

The transistor TR is, for example, a MOSFET, and includes a gate terminal connected to the metal pad 44, the capacitor Cb, and the current source Ia, and a source terminal and a drain terminal disposed between a power supply potential and the current source Ib. The transistor TR in the present embodiment constitutes a signal processing circuit that processes a voltage signal from the photoelectric conversion element PD together with other circuit elements in the second area U2. The electric resistance R is disposed between the photoelectric conversion element PD and the signal processing circuit.

The current source Ia is disposed between the power supply potential and the metal pad 44. The current source Ib is disposed between the transistor TR and the ground potential. In addition, one electrode of the capacitor Cb is connected to the metal pad 44, the current source Ia, and the transistor TR, and the other electrode of the capacitor Cb is connected to the ground potential.

Here, the action of the electric resistance R will be described.

In a case where the SPAD is used as the photoelectric conversion element PD, the amplitude of the voltage signal output from the photoelectric conversion element PD is, for example, 20 to 30 V. In the present embodiment, this voltage signal is transmitted to the above-described signal processing circuit via the electric resistance R. This makes it possible to suppress supply of a large amplitude voltage signal to the signal processing circuit.

In addition, since the electric resistance R in the present embodiment is achieved by the resistance layer 5, its parasitic capacitance is small. Therefore, even if a large amplitude voltage signal is generated in the photoelectric conversion element PD, the charge required for charging and discharging the parasitic capacitance is reduced. As a result, it is possible to achieve reduction in power consumption and increase in speed in each pixel 31.

The number of pixels 31 in the pixel array region 32 is, for example, 10,000 to 10 million. Therefore, if the power consumption of each pixel 31 can be reduced by P, a large amount of power consumption of 10,000 times to 10 million times P can be reduced in the entire pixel array region 32. Therefore, according to the present embodiment, the power consumption of the semiconductor device (solid-state imaging device) can be greatly reduced.

Figure 23:
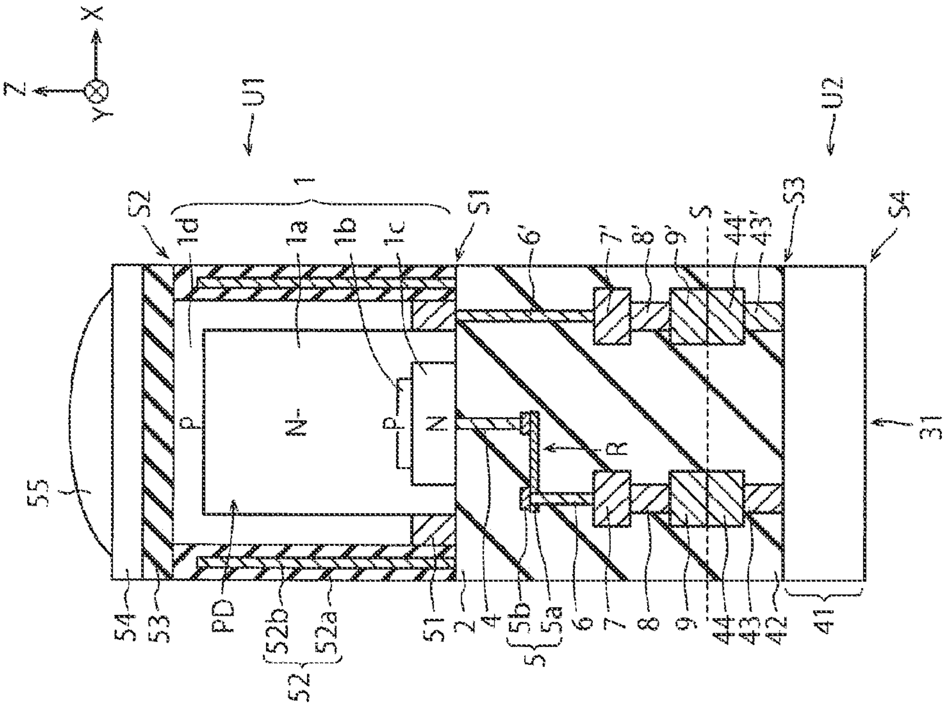
FIG. 23 is a cross-sectional view depicting the structure of the semiconductor device according to the sixth embodiment.

FIG. 23 is a cross-sectional view depicting the structure of the semiconductor device according to the sixth embodiment.

FIG. 23 illustrates a cross section of one pixel 31 included in the semiconductor device according to the present embodiment. The semiconductor device according to the present embodiment is manufactured by bonding a first wafer including the first area U1 and a second wafer including the second area U2. At this time, the first wafer is turned upside down and bonded to the second wafer. Therefore, in FIG. 23, the plug electrode 4, the resistance layer 5, the plug electrode 6, and the like are located below the substrate 1. This will be described later in detail.

As illustrated in FIG. 23, the second area U2 includes a support substrate 41, an interlayer insulating film 42, plug electrodes 43 and 43', and metal pads 44 and 44'. Furthermore, the first area U1 includes a plug electrode 6', a wire 7', plug electrodes 8 and 8', metal pads 9 and 9', an electrode 51, a pixel isolation portion 52, a planarization film 53, a color filter 54, and an on-chip lens 55, in addition to the substrate 1, the interlayer insulating film 2, the plug electrode 4, the resistance layer 5 (the high-resistance layer 5*a* and the low-resistance layer 5*b*), the plug electrode 6, and the wire 7 described above.

Further, the substrate 1 includes an N− type semiconductor region 1*a*, a P type semiconductor region 1*b*, an N type semiconductor region 1*c*, and a P type semiconductor region 1*d* as impurity semiconductor regions. Further, the pixel isolation portion 52 includes an element isolation insulating film 52*a* and a light shielding film 52*b*.

FIG. 23 further illustrates a front surface S1 of the substrate 1, a back surface S2 of the substrate 1, a front surface S3 of the support substrate 41, a back surface S4 of the support substrate 41, and a bonding surface between the first area U1 and the second area U2. The front surface S1 of the substrate 1 is an example of a first surface in the present disclosure. The back surface S2 of the substrate 1 is an example of a second surface in the present disclosure. In FIG. 23, the front surface S1 is a surface of the substrate 1 in the −Z direction, the back surface S2 is a surface of the substrate 1 in the +Z direction, the front surface S3 is a surface of the support substrate 41 in the +Z direction, and the back surface S4 is a surface of the support substrate 41 in the −Z direction.

The N− type semiconductor region 1*a*, the P type semiconductor region 1*b*, and the N type semiconductor region 1*c* are sequentially formed in the substrate 1 from the back surface S2 toward the front surface S1 of the substrate 1. The P type semiconductor region 1*d* is formed on the upper surface and the side surface of the N− type semiconductor region 1*a* in the substrate 1 illustrated in FIG. 23. The photoelectric conversion unit PD in the present embodiment is achieved by PN junction between these impurity semiconductor regions. Note that the N− type semiconductor region 1*a* may be replaced with a P− type semiconductor region. In addition, the P type semiconductor region 1*b*, the N type semiconductor region 1*c*, and the P type semiconductor region 1*d* function as a multiplication region, an anode electrode, and a hole accumulation layer of the photoelectric conversion unit PD, respectively. The photoelectric conversion unit PD illustrated in FIG. 23 is, for example, a SPAD.

The plug electrode 4, the resistance layer 5, the plug electrode 6, the wire 7, the plug electrode 8, and the metal pad 9 are sequentially formed on the front surface S1 of the substrate 1 in the interlayer insulating film 2, and are electrically connected to the N type semiconductor region 1*c*. In addition, the plug electrode 6', the wire 7', the plug electrode 8', and the metal pad 9' are sequentially formed on the front surface S1 of the substrate 1 in the interlayer insulating film 2, and are electrically connected to the electrode 51 in the substrate 1. The metal pads 9 and 9' are, for example, metal layers containing copper (Cu). As illustrated in FIG. 23, the above-described electric resistance R is implemented by the resistance layer 5.

The support substrate 41 is, for example, a semiconductor substrate such as a silicon substrate. The signal processing circuit and the transistor TR are formed on the front surface S3 of the support substrate 41. The plug electrode 43 and the metal pad 44 are sequentially formed on the front surface S3 of the support substrate 41 in the interlayer insulating film 42, and are electrically connected to the support substrate 41. The plug electrode 43' and the metal pad 44' are sequentially formed on the front surface S3 of the support substrate 41 in the interlayer insulating film 42, and are electrically connected to the support substrate 41. The metal pads 44 and 44' are, for example, metal layers containing copper (Cu).

The metal pad 44 is bonded to the metal pad 9. In addition, the metal pad 44' is bonded to the metal pad 9'. As a result, the second area U2 is electrically connected to the first area U1.

The electrode 51 is formed in the substrate 1 and is located on the side of the N− type semiconductor region 1*a* or below the P type semiconductor region 1*d*. The electrode 51 functions as a cathode electrode of the photoelectric conversion unit PD. The photoelectric conversion unit PD in the present embodiment is a surface cathode type SPAD having a cathode electrode (electrode 51) on the front surface S1 side of the substrate 1.

The pixel isolation portion 52 is formed between the pixel 31 and another pixel 31 illustrated in FIG. 23 in the substrate 1. The pixel isolation portion 52 in the present embodiment penetrates the substrate 1 between the front surface S1 and the back surface S2 of the substrate 1. The pixel isolation portion 52 includes the element isolation insulating film 52*a* and the light shielding film 52*b* sequentially formed in a groove formed in the substrate 1. The element isolation insulating film 52*a* is, for example, a silicon oxide film. The element isolation insulating film 52*a* may further include a fixed charge film (film having a negative fixed charge). Examples of the fixed charge film include insulating films such as a high dielectric film and a high refractive index material film. The light shielding film 52*b* is a film including a material that shields light, and is, for example, a metal film containing aluminum (Al), tungsten (W), or copper (Cu).

The planarization film 53 is formed on the substrate 1 or the pixel isolation portion 52, so that the upper surface of the back surface S2 of the substrate 1 is flat. The planarization film 53 is, for example, an organic film such as a resin film.

The color filter 54 is formed on the planarization film 53 for each pixel 31. For example, the color filters 54 for red (R), green (G), and blue (B) are arranged above the photoelectric conversion units PD of the red, green, and blue pixels 31, respectively. Furthermore, these color filters 54 may include a color filter 54 for infrared light disposed above the photoelectric conversion unit PD of the pixel 31 for infrared light. Each color filter 54 has a property capable of transmitting light having a predetermined wavelength, and the light transmitted through each color filter 54 enters the photoelectric conversion unit PD.

The on-chip lens 55 is formed for each pixel 31 on the color filter 54. The on-chip lens 55 has a property of condensing incident light, and the light condensed by the on-chip lens 55 is incident on the photoelectric conversion unit PD via the color filter 54. As described above, the semiconductor device according to the present embodiment is a back-illuminated solid-state imaging device.

Note that, in a case where a certain pixel 31 is used for distance measurement, the color filter 54 may not be disposed above the photoelectric conversion unit PD of the pixel 31. In this pixel 31, the on-chip lens 55 is disposed above the photoelectric conversion unit PD without the color filter 54. An example of the distance measurement method in this case is a time of flight (ToF) method.

As described above, the semiconductor device according to the present embodiment is a solid-state imaging device including the first area U1 and the second area U2. The anode electrode (N type semiconductor region 1*c*) of the photoelectric conversion unit PD is electrically connected to the signal processing circuit on the support substrate 41 via the resistance layer 5 (electric resistance R) and the metal pads 9 and 44. On the other hand, the cathode electrode (electrode 51) of the photoelectric conversion unit PD is electrically connected to the ground potential via the metal pads 9' and 44' and the support substrate 41. Note that the semiconductor device according to the present embodiment may further include an electric circuit other than the signal processing circuit on the support substrate 41. Examples of such an electric circuit include a read circuit and a drive circuit.

Figure 24:
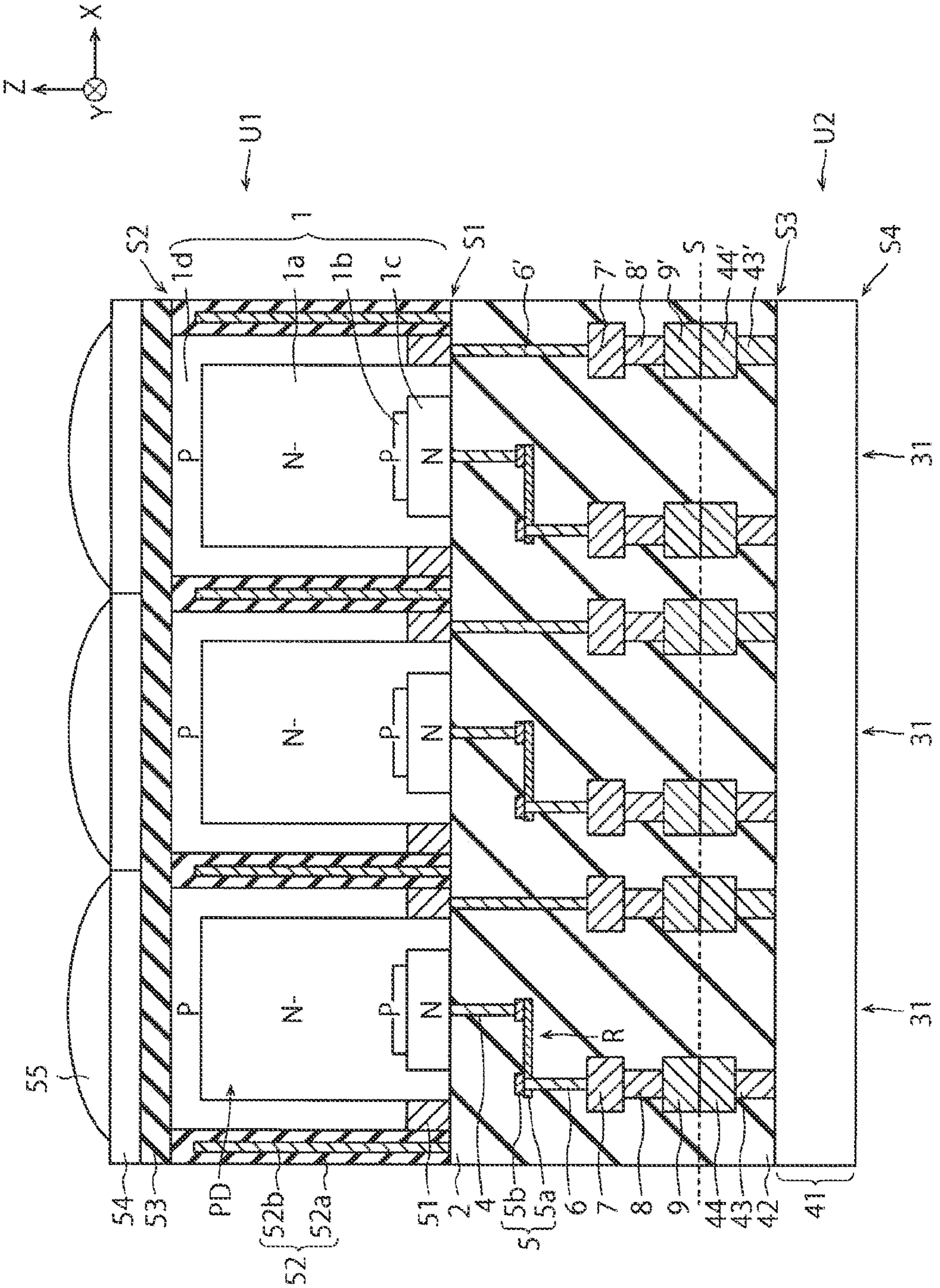
FIG. 24 is another cross-sectional view depicting the structure of the semiconductor device according to the sixth embodiment.

FIG. 24 is another cross-sectional view depicting the structure of the semiconductor device according to the sixth embodiment.

FIG. 24 illustrates three pixels 31 among the plurality of pixels 31 included in the semiconductor device according to the present embodiment. The structure of each pixel 31 is the same as the structure of the pixel 31 illustrated in FIG. 23. In FIG. 24, the pixel isolation portion 52 is disposed between the pixels 31 adjacent to each other as described above. Further, the color filter 54 and the on-chip lens 55 are disposed for each pixel 31.

Figure 25:
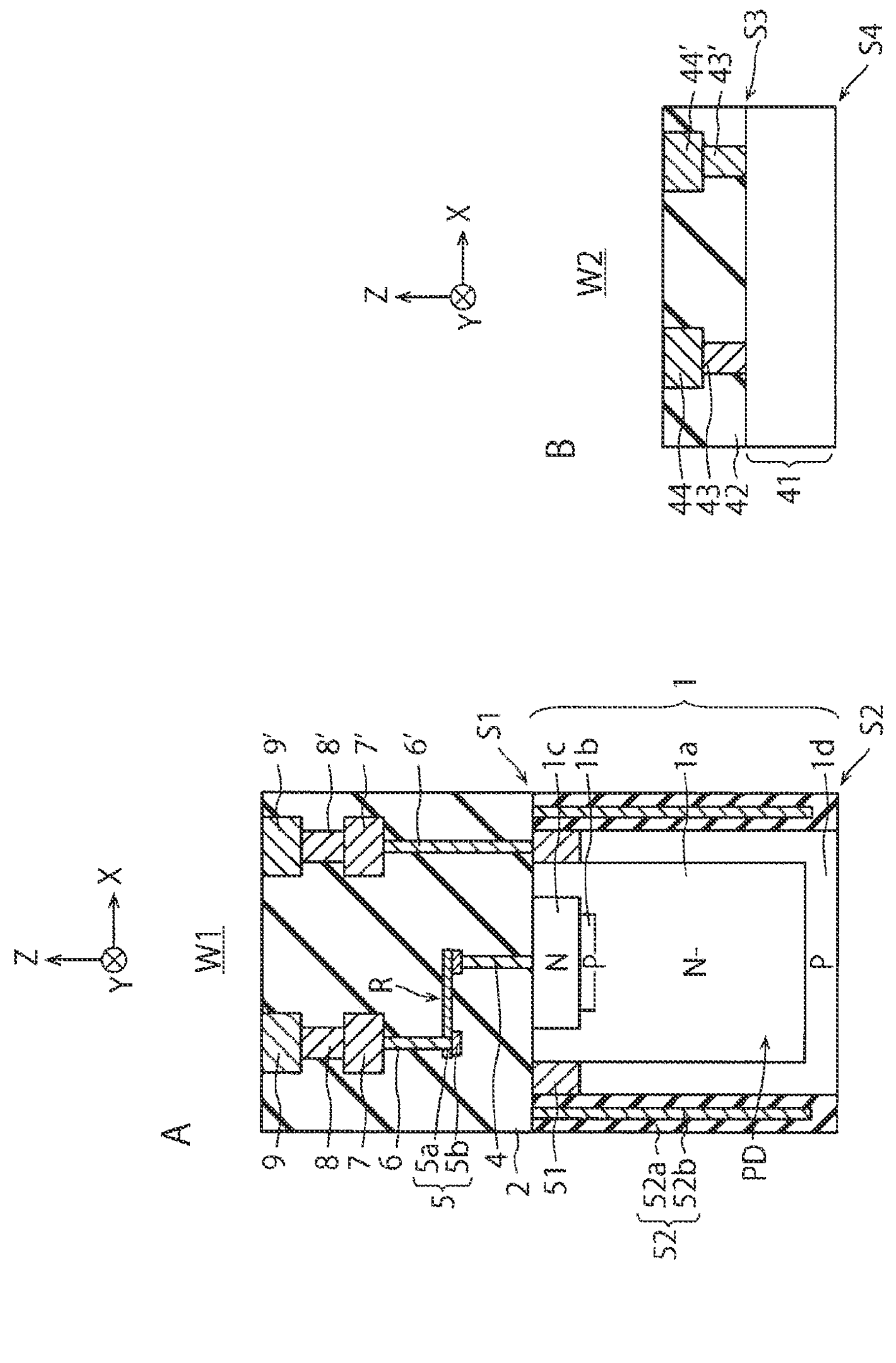
FIG. 25 is a cross-sectional view (1/2) depicting a method for manufacturing the semiconductor device according to the sixth embodiment.
Figure 26:
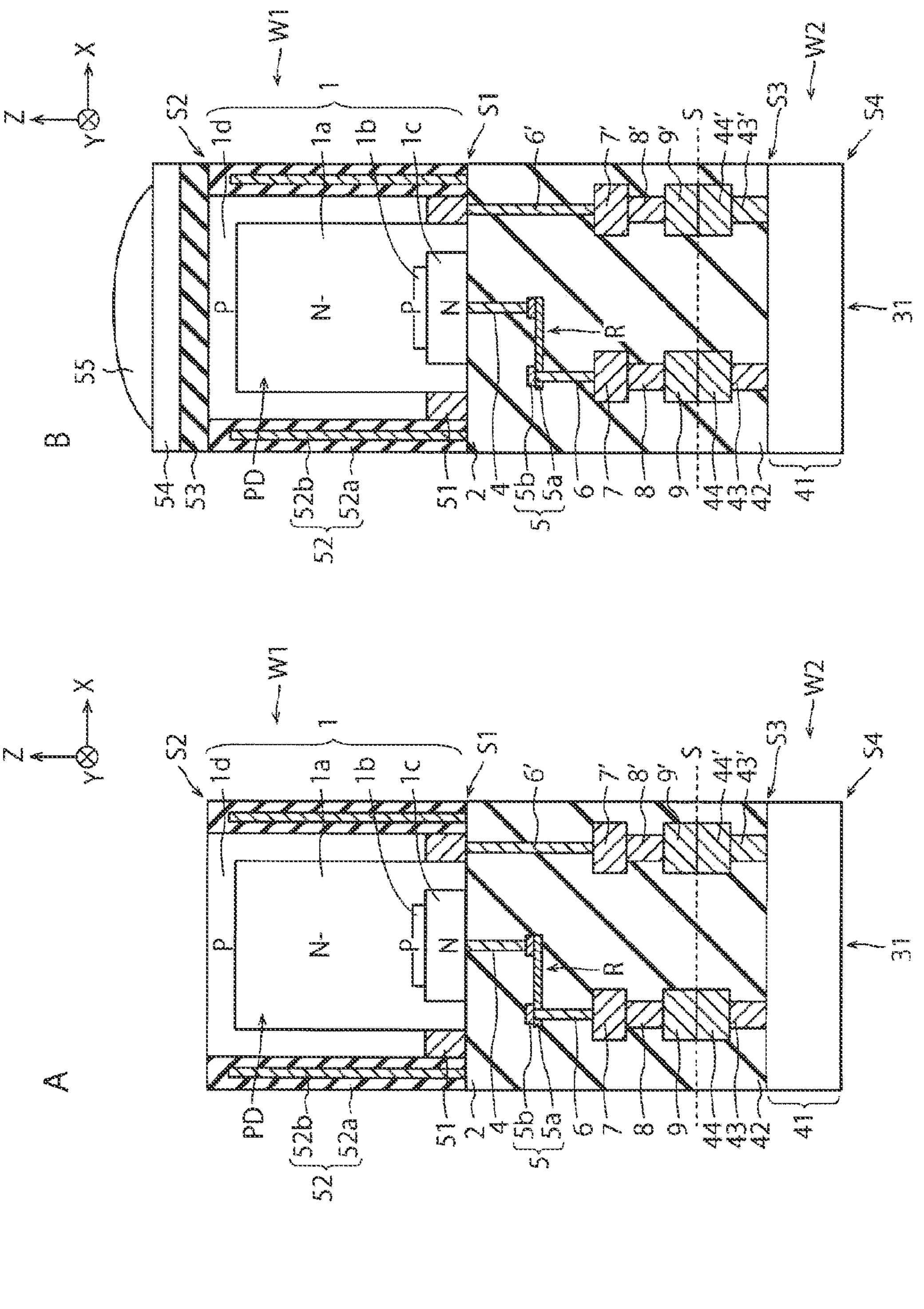
FIG. 26 is a cross-sectional view (2/2) depicting the method for manufacturing the semiconductor device according to the sixth embodiment.

FIGS. 25 and 26 are cross-sectional views illustrating a method for manufacturing the semiconductor device according to the sixth embodiment.

First, a first wafer W1 illustrated in A of FIG. 25 and a second wafer W2 illustrated in B of FIG. 25 are manufactured. The first wafer W1 includes the above-described first area U1, and specifically includes the N− type semiconductor region 1*a*, the P type semiconductor region 1*b*, the N type semiconductor region 1*c*, the P type semiconductor region 1*d*, the electrode 51, and the pixel isolation portion 52 which are formed in the substrate 1, and the interlayer insulating film 2, the plug electrode 4, the resistance layer 5, the plug electrodes 6 and 6', the wires 7 and 7', the plug electrodes 8 and 8', and the metal pads 9 and 9' which are formed on the front surface S1 of the substrate 1. The second wafer W2 includes the above-described second area U2, and specifically includes the interlayer insulating film 42, the plug electrodes 43 and 43', and the metal pads 44 and 44' which are formed on the front surface S3 of the support substrate 41. The above-described signal processing circuit is also formed on the support substrate 41 in the step illustrated in B of FIG. 25.

Next, the first wafer W1 is bonded to the second wafer W2 (A of FIG. 26). As a result, the metal pads 9 and 9' are bonded to the metal pads 44 and 44', respectively, so that the second area U2 is electrically connected to the first area U1. In addition, the interlayer insulating film 2 is bonded to the interlayer insulating film 42.

Next, the planarization film 53 is formed on the back surface S2 of the substrate 1, and the color filter 54 and the on-chip lens 55 are sequentially formed on the planarization film 53 for each pixel 31 (B of FIG. 26).

Thereafter, the first and second wafers W1 and W2 are divided into individual chips by dicing. In this way, the semiconductor device according to the present embodiment is manufactured.

Figure 28:
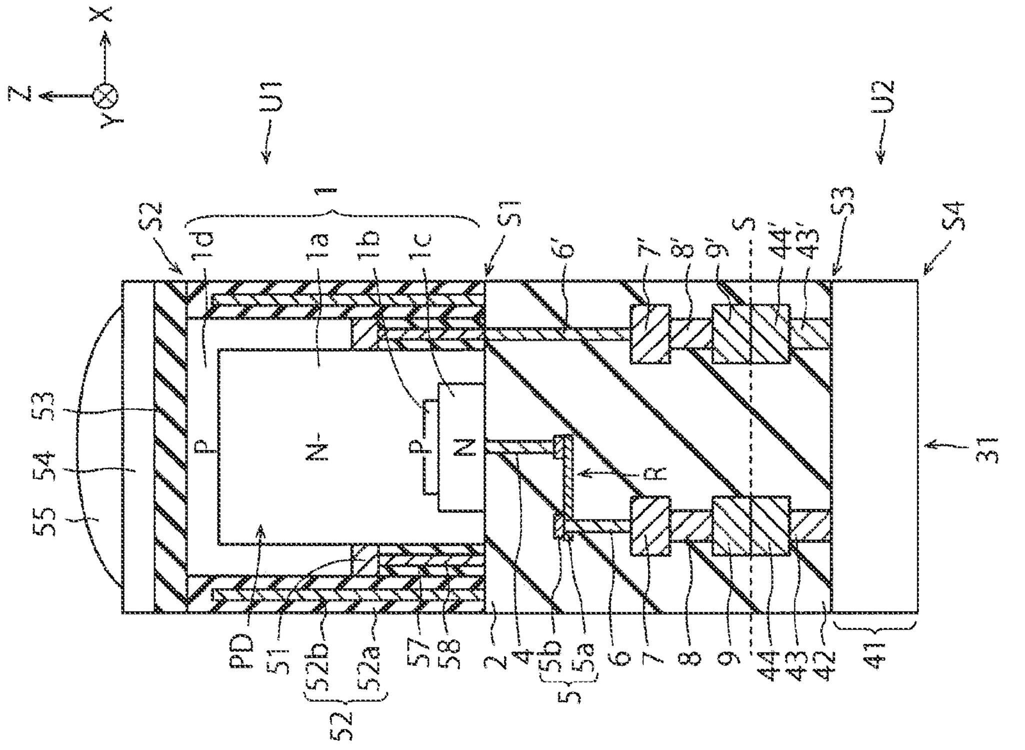
FIG. 28 is a cross-sectional view (2/2) depicting the structure of the semiconductor device according to the modification of the sixth embodiment.
Figure 27:
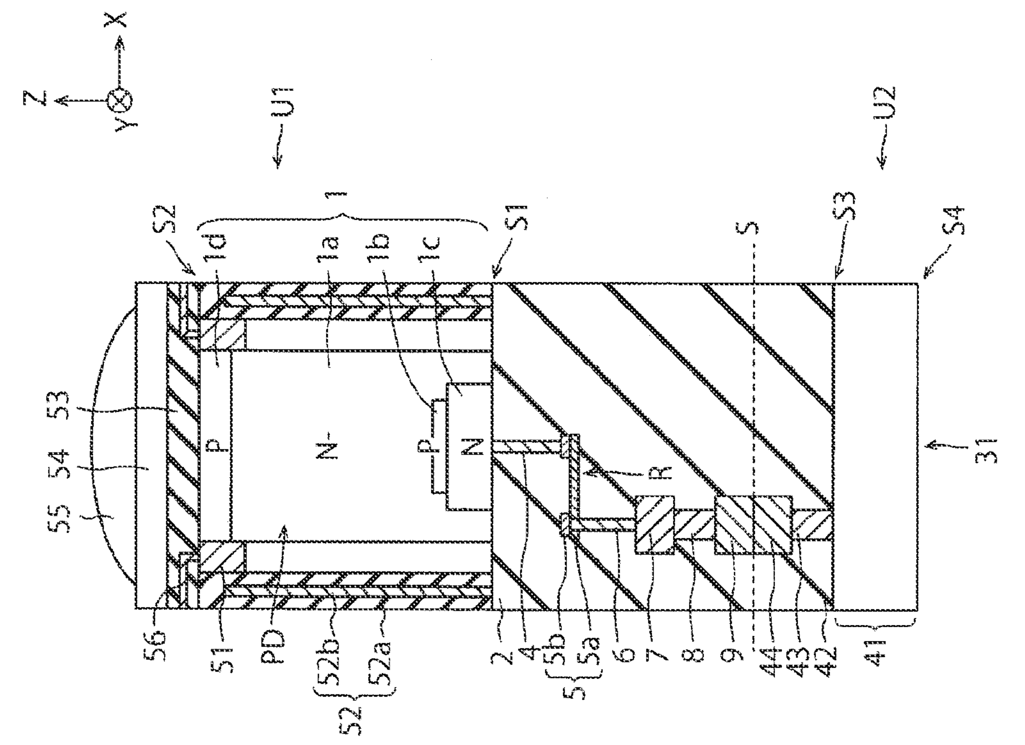
FIG. 27 is a cross-sectional view (1/2) depicting the structure of a semiconductor device according to a modification of the sixth embodiment.

FIGS. 27 and 28 are cross-sectional views illustrating a structure of a semiconductor device according to a modification of the sixth embodiment.

The semiconductor device illustrated in FIG. 27 includes a wire 56 in addition to the components illustrated in FIG. 23. A cathode electrode (electrode 51) illustrated in FIG. 27 is disposed in the substrate 1 near the back surface S2 of the substrate 1. Therefore, the photoelectric conversion unit PD illustrated in FIG. 27 is a back-surface cathode type SPAD having a cathode electrode (electrode 51) on the back surface S2 side of the substrate 1. The wire 56 is formed in the planarization film 53, and electrically connects the electrode 51 to the ground potential. Note that the semiconductor device illustrated in FIG. 27 does not include the plug electrode 6', the wire 7', the plug electrode 8', the metal pad 9', the plug electrode 43', and the metal pad 44'.

The semiconductor device illustrated in FIG. 28 includes an insulating film 57 and a plug electrode 58 in addition to the components illustrated in FIG. 23. A cathode electrode (electrode 51) illustrated in FIG. 28 is embedded in a hole formed in the substrate 1 from the front surface S1 of the substrate 1. Therefore, the photoelectric conversion unit PD illustrated in FIG. 28 is an embedded cathode type SPAD having a cathode electrode (electrode 51) in the hole of the substrate 1. The insulating film 57 and the plug electrode 58 are sequentially formed in the hole, and the plug electrode 6' is electrically connected to the electrode 51 via the plug electrode 58. On the other hand, the plug electrode 6' is electrically connected to the ground potential via the support substrate 41 as described above.

As described above, according to the present embodiment, the semiconductor devices of the first to fourth embodiments can be applied to a solid-state imaging device. Note that the semiconductor devices according to the first to fourth embodiments may be applied to devices other than the solid-state imaging device. Examples of such devices include analog circuit devices and high frequency circuit devices.

Application Example

Figure 29:
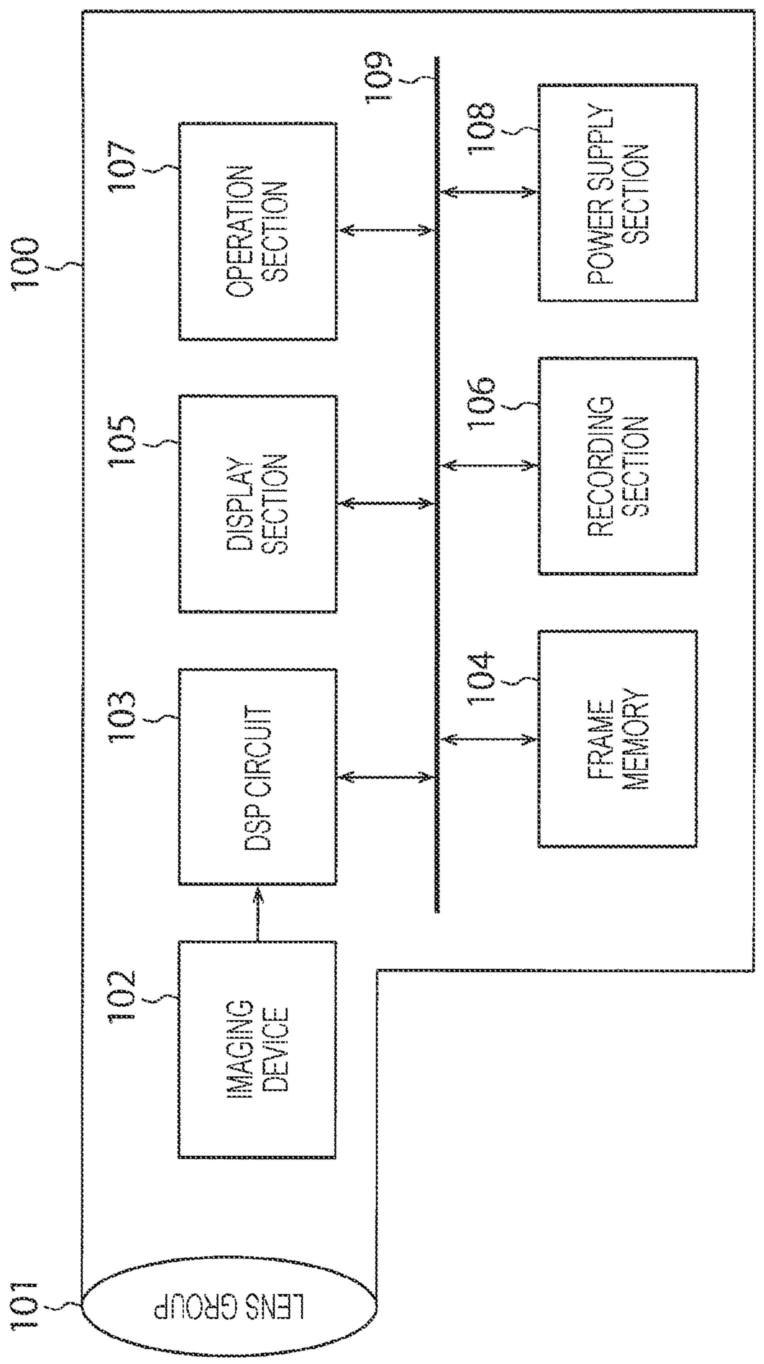
FIG. 29 is a block diagram depicting a configuration example of an electronic device.

FIG. 29 is a block diagram depicting a configuration example of an electronic device. The electronic device illustrated in FIG. 29 is a camera 100.

The camera 100 includes an optical unit 101 including a lens group and the like, an imaging device 102 that is a solid-state imaging device according to the sixth embodiment, a digital signal processor (DSP) circuit 103 that is a camera signal processing circuit, a frame memory 104, a display section 105, a recording section 106, an operation section 107, and a power supply section 108. In addition, the DSP circuit 103, the frame memory 104, the display section 105, the recording section 106, the operation section 107, and the power supply section 108 are connected to each other via a bus line 109.

The optical unit 101 captures incident light (image light) from a subject and forms an image on an imaging surface of the imaging device 102. The imaging device 102 converts an amount of incident light formed into an image on the imaging surface by the optical unit 101 into an electric signal on a pixel-by-pixel basis and outputs the electric signal as a pixel signal.

The DSP circuit 103 performs signal processing on the pixel signal output from the imaging device 102. The frame memory 104 is a memory for storing one screen of a moving image or a still image captured by the imaging device 102.

The display section 105 includes, for example, a panel type display device such as a liquid crystal panel or an organic EL panel, and displays a moving image or a still image captured by the imaging device 102. The recording section 106 records a moving image or a still image captured by the imaging device 102 on a recording medium such as a hard disk or a semiconductor memory.

The operation section 107 issues operation commands for various functions of the camera 100 in response to an operation performed by a user. The power supply section 108 appropriately supplies various power supplies, which are operation power supplies for the DSP circuit 103, the frame memory 104, the display section 105, the recording section 106, and the operation section 107, to these power supply targets.

It can be expected to acquire a satisfactory image by using the solid-state imaging device according to the sixth embodiment as the imaging device 102.

The solid-state imaging device can be applied to various other products. For example, the solid-state imaging device may be mounted on any type of mobile bodies such as vehicles, electric vehicles, hybrid electric vehicles, motorcycles, bicycles, personal mobilities, airplanes, drones, ships, and robots.

Figure 30:
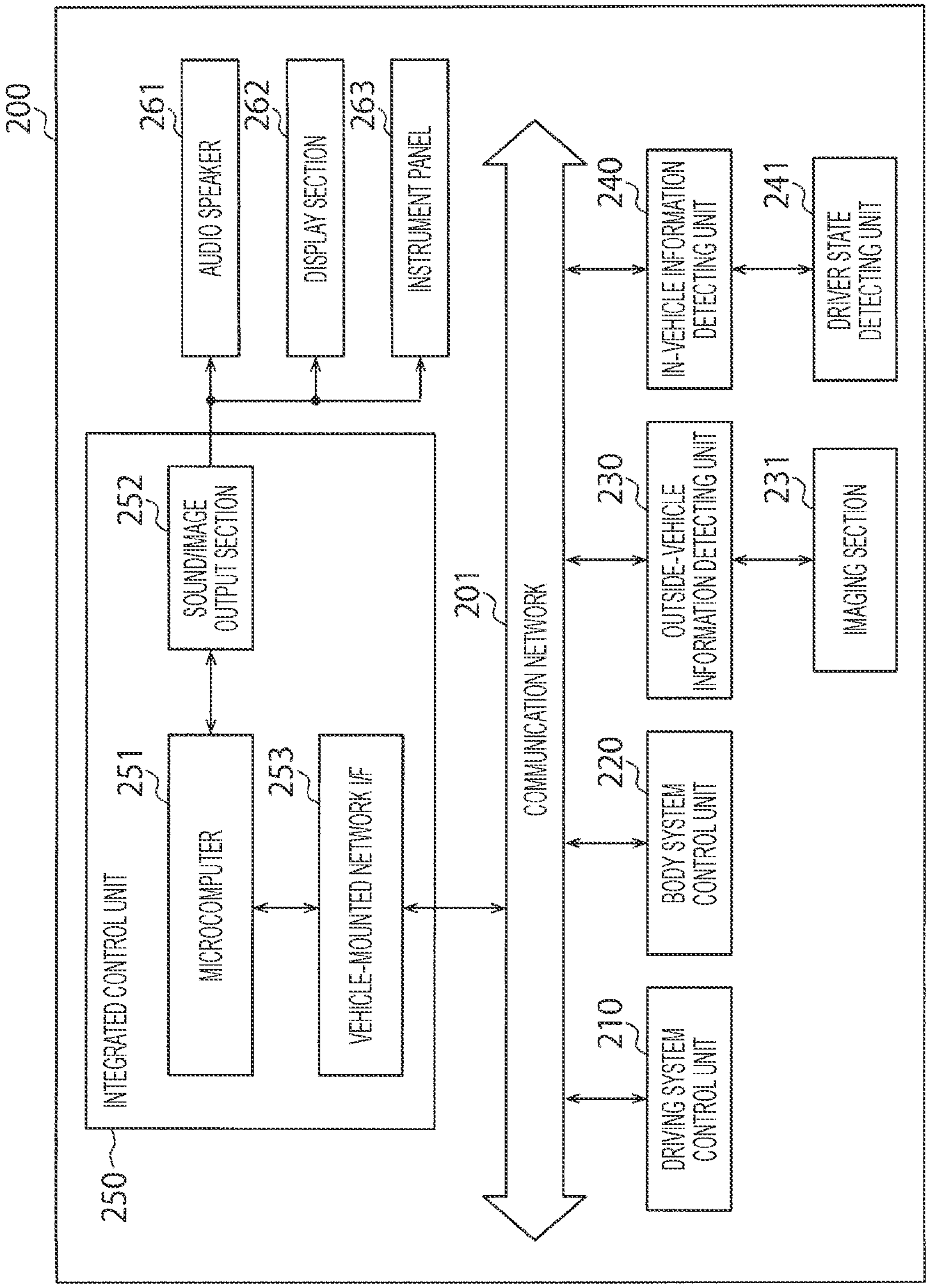
FIG. 30 is a block diagram depicting a configuration example of a mobile body control system.

FIG. 30 is a block diagram depicting a configuration example of a mobile body control system. The mobile body control system illustrated in FIG. 30 is a vehicle control system 200.

The vehicle control system 200 includes a plurality of electronic control units connected to each other via a communication network 201. In the example depicted in FIG. 30, the vehicle control system 200 includes a driving system control unit 210, a body system control unit 220, an outside-vehicle information detecting unit 230, an in-vehicle information detecting unit 240, and an integrated control unit 250. FIG. 30 also illustrates a microcomputer 251, a sound/image output section 252, and a vehicle-mounted network interface (I/F) 253 as components of the integrated control unit 250.

The driving system control unit 210 controls the operation of devices related to a driving system of a vehicle in accordance with various kinds of programs. For example, the driving system control unit 210 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 220 controls the operation of various kinds of devices provided to a vehicle body in accordance with various kinds of programs. For example, the body system control unit 220 functions as a control device for a smart key system, a keyless entry system, a power window device, or various kinds of lamps (for example, a headlamp, a backup lamp, a brake lamp, a turn signal, a fog lamp, or the like). In this case, radio waves transmitted from a mobile device as an alternative to a key or signals of various kinds of switches can be input to the body system control unit 220. The body system control unit 220 receives these input radio waves or signals, and controls a door lock device, the power window device, the lamps, or the like of the vehicle.

The outside-vehicle information detecting unit 230 detects information about the outside of the vehicle including the vehicle control system 200. For example, the outside-vehicle information detecting unit 230 is connected with an imaging section 231. The outside-vehicle information detecting unit 230 makes the imaging section 231 capture an image of the outside of the vehicle, and receives the captured image from the imaging section 231. On the basis of the received image, the outside-vehicle information detecting unit 230 may perform processing of detecting an object such as a human, a vehicle, an obstacle, a sign, a character on a road surface, or the like, or processing of detecting a distance thereto.

The imaging section 231 is an optical sensor that receives light and that outputs an electric signal corresponding to the amount of received light. The imaging section 231 can output the electric signal as an image, or can output the electric signal as information about a measured distance. The light received by the imaging section 231 may be visible light, or may be invisible light such as infrared rays or the like. The imaging section 231 includes the solid-state imaging device according to the sixth embodiment.

The in-vehicle information detecting unit 240 detects information about the inside of the vehicle equipped with the vehicle control system 200. The in-vehicle information detecting unit 240 is, for example, connected with a driver state detecting section 241 that detects the state of a driver. The driver state detecting section 241, for example, includes a camera that images the driver. On the basis of detection information input from the driver state detecting section 241, the in-vehicle information detecting unit 240 may calculate a degree of fatigue of the driver or a degree of concentration of the driver, or may determine whether or not the driver is dozing. The camera may include the solid-state imaging device according to the sixth embodiment, and may be, for example, the camera 100 illustrated in FIG. 29.

The microcomputer 251 can calculate a control target value for the driving force generating device, the steering mechanism, or the braking device on the basis of the information about the inside or outside of the vehicle obtained by the outside-vehicle information detecting unit 230 or the in-vehicle information detecting unit 240, and output a control command to the driving system control unit 210. For example, the microcomputer 251 can perform cooperative control intended to implement functions of an advanced driver assistance system (ADAS), the functions including collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 251 can perform cooperative control intended for automated driving, which makes the vehicle travel automatedly without depending on the operation of the driver, or the like, by controlling the driving force generating device, the steering mechanism, the braking device, or the like on the basis of the information about the outside or inside of the vehicle obtained by the outside-vehicle information detecting unit 230 or the in-vehicle information detecting unit 240.

In addition, the microcomputer 251 can output a control command to the body system control unit 220 on the basis of the information about the outside of the vehicle obtained by the outside-vehicle information detecting unit 230. For example, the microcomputer 251 can perform cooperative control intended to prevent a glare by controlling the headlamp so as to change from a high beam to a low beam, for example, in accordance with the position of a preceding vehicle or an oncoming vehicle detected by the outside-vehicle information detecting unit 230.

The sound/image output section 252 transmits an output signal of at least one of a sound or an image to an output device capable of visually or auditorily providing information to an occupant of the vehicle or the outside of the vehicle. In the example of FIG. 30, an audio speaker 261, a display section 262, and an instrument panel 263 are illustrated as the output device described above. The display section 262 may, for example, include an on-board display or a head-up display.

Figure 31:
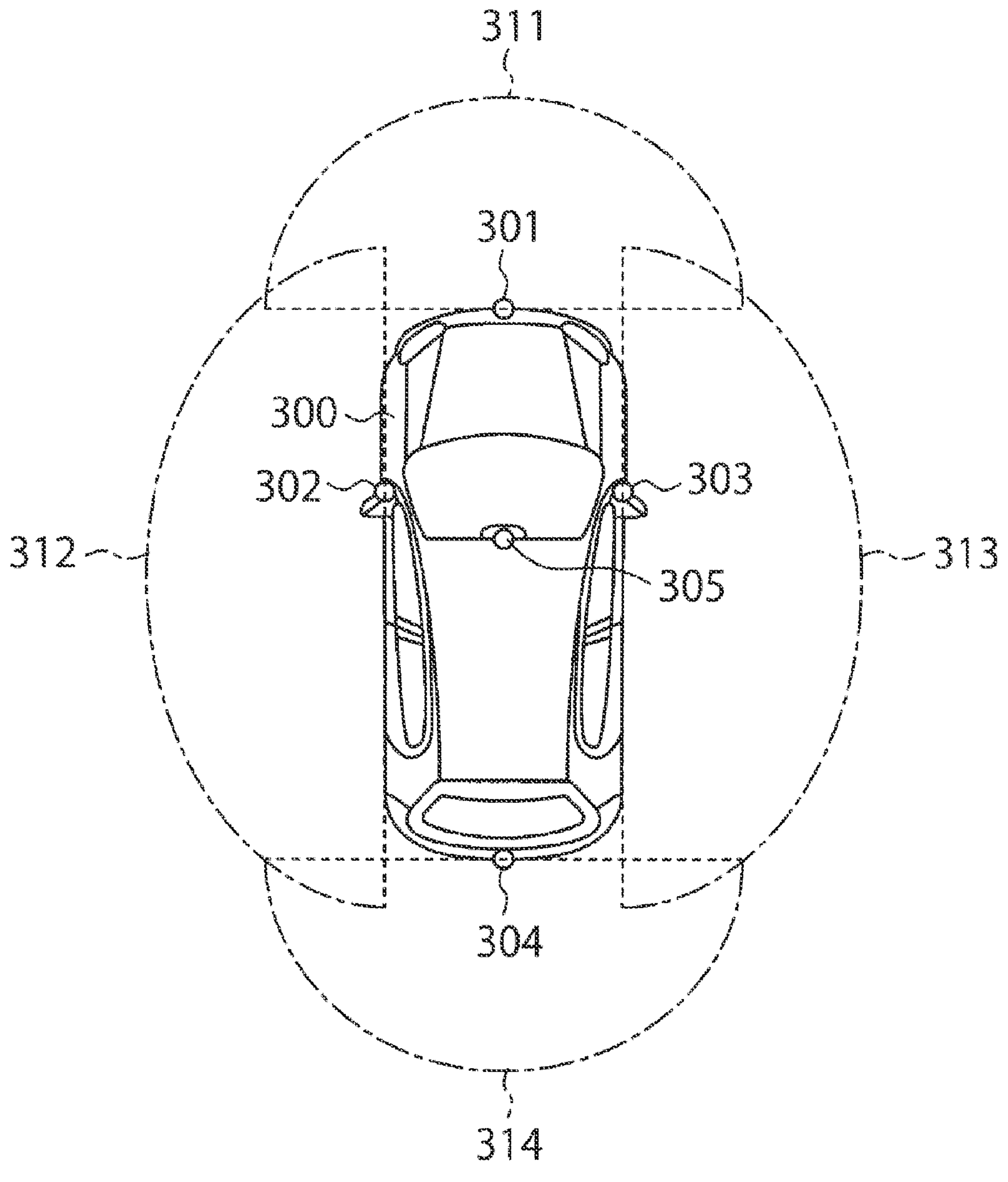
FIG. 31 is a plan view depicting a specific example of a setting position of an imaging section in FIG. 30.

FIG. 31 is a plan view depicting a specific example of a setting position of the imaging section 231 in FIG. 30.

A vehicle 300 illustrated in FIG. 31 includes imaging sections 301, 302, 303, 304, and 305 as the imaging section 231. The imaging sections 301, 302, 303, 304, and 305 are, for example, disposed at positions on a front nose, sideview mirrors, a rear bumper, and a back door of the vehicle 300 as well as a position on an upper portion of a windshield within the interior of the vehicle.

The imaging section 301 provided to the front nose mainly obtains an image of an environment in front of the vehicle 300. The imaging sections 302 and 303 provided to the sideview mirrors obtain mainly an image of an environment on the side of the vehicle 300. The imaging section 304 provided to the rear bumper or the back door mainly obtains an image of an environment behind the vehicle 300. The imaging section 305 provided to the upper portion of the windshield within the interior of the vehicle mainly obtains an image of an environment in front of the vehicle 300. The imaging section 305 is used mainly to detect, for example, a preceding vehicle, a pedestrian, an obstacle, a signal, a traffic sign, a lane, or the like.

FIG. 31 illustrates an example of imaging ranges of the imaging sections 301, 302, 303, and 304 (hereinafter referred to as "imaging sections 301 to 304"). An imaging range 311 represents the imaging range of the imaging section 301 provided to the front nose. An imaging range 312 represents the imaging range of the imaging section 302 provided to the left sideview mirror. An imaging range 313 represents the imaging range of the imaging section 303 provided to the right sideview mirror. An imaging range 314 represents the imaging range of the imaging section 304 provided to the rear bumper or the back door. A bird's-eye image of the vehicle 300 as viewed from above is obtained by superimposing image data captured by the imaging sections 301 to 304, for example. Hereinafter, the imaging ranges 311, 312, 313, and 314 are referred to as "imaging ranges 311 to 314".

At least one of the imaging sections 301 to 304 may have a function of obtaining distance information. For example, at least one of the imaging sections 301 to 304 may be a stereo camera including a plurality of imaging devices or an imaging device including pixels for phase difference detection.

For example, the microcomputer 251 (FIG. 30) can determine a distance to each three-dimensional object within the imaging ranges 311 to 314 and a temporal change in the distance (relative speed with respect to the vehicle 300) on the basis of the distance information obtained from the imaging sections 301 to 304. On the basis of the calculation results, the microcomputer 251 can extract, as a preceding vehicle, a nearest three-dimensional object that is present on a traveling path of the vehicle 300 and travels in substantially the same direction as the vehicle 300 at a predetermined speed (for example, equal to or more than 0 km/h). Further, the microcomputer 251 can set a following distance to be maintained from a preceding vehicle in advance, and perform automatic brake control (including following stop control), automatic acceleration control (including following start control), or the like. According to this example, it is thus possible to perform cooperative control intended for automated driving that makes the vehicle travel automatedly without depending on the operation of the driver or the like.

For example, the microcomputer 251 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 301 to 304, extract the classified three-dimensional object data, and use the extracted three-dimensional object data for automatic avoidance of an obstacle. For example, the microcomputer 251 identifies obstacles around the vehicle 300 as obstacles that the driver of the vehicle 300 can recognize visually and obstacles that are difficult for the driver of the vehicle 300 to recognize visually. Then, the microcomputer 251 determines a collision risk indicating a risk of collision with each obstacle. In a situation in which the collision risk is equal to or higher than a set value and there is thus a possibility of collision, the microcomputer 251 outputs a warning to the driver via the audio speaker 261 or the display section 262, and performs forced deceleration or avoidance steering via the driving system control unit 210. The microcomputer 251 can thereby assist in driving to avoid collision.

At least one of the imaging sections 301 to 304 may be an infrared camera that detects infrared rays. The microcomputer 251 can, for example, recognize a pedestrian by determining whether or not there is a pedestrian in captured images captured by the imaging sections 301 to 304. Such recognition of a pedestrian is, for example, performed by a procedure of extracting characteristic points in the captured images captured by the imaging sections 301 to 304 as infrared cameras and a procedure of determining whether or not an object is a pedestrian by performing pattern matching processing on a series of characteristic points representing the contour of the object. When the microcomputer 251 determines that there is a pedestrian in the captured images captured by the imaging sections 301 to 304, and thus recognizes the pedestrian, the sound/image output section 252 controls the display section 262 so that a square contour line for emphasis is displayed so as to be superimposed on the recognized pedestrian. The sound/image output section 252 may also control the display section 262 so that an icon or the like representing the pedestrian is displayed at a desired position.

Figure 32:
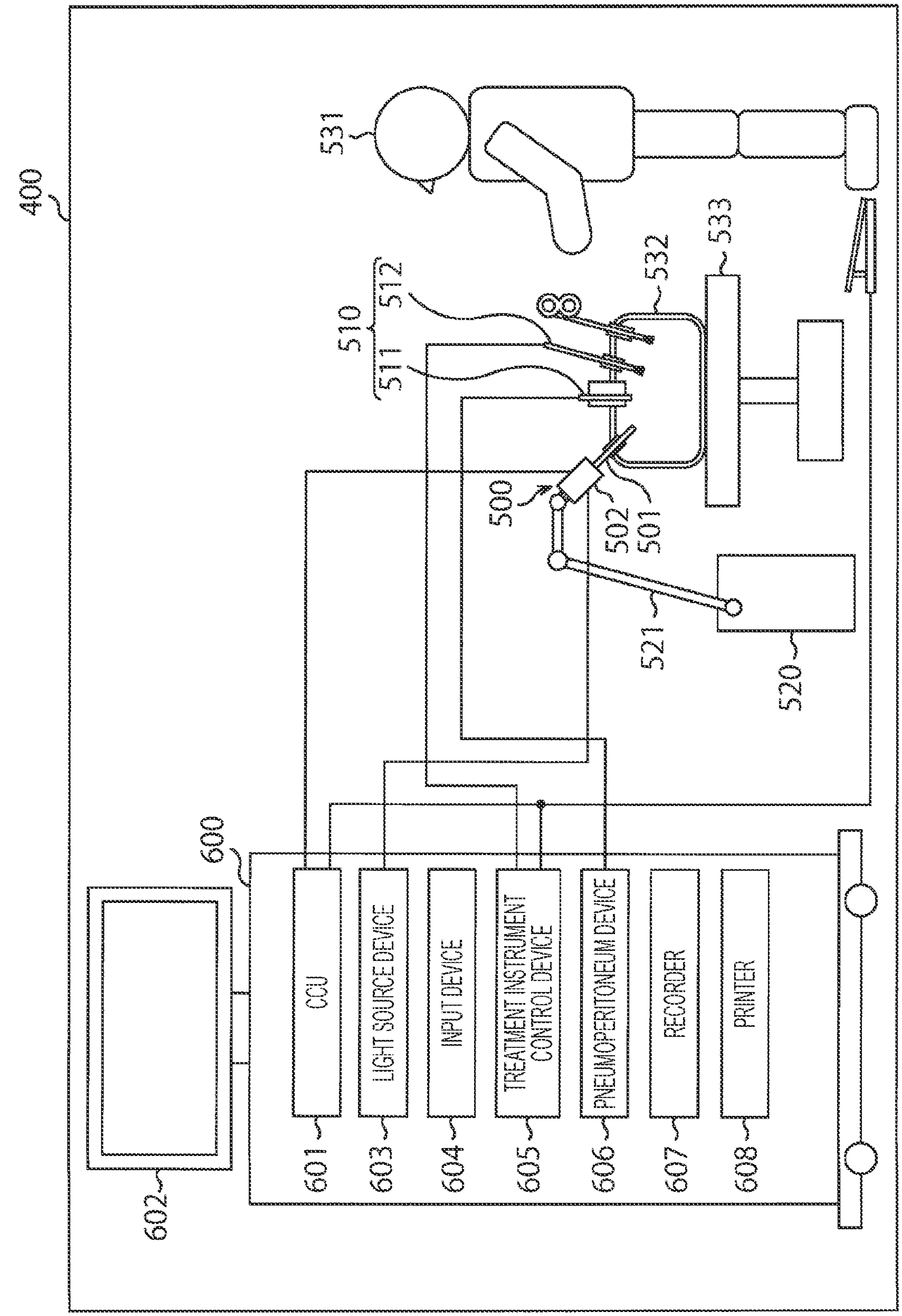
FIG. 32 is a diagram depicting an example of a schematic configuration of an endoscopic surgical system.

FIG. 32 is a diagram depicting an example of a schematic configuration of an endoscopic surgical system to which the technology (present technology) according to the present disclosure can be applied.

FIG. 32 illustrates a state in which an operator (surgeon) 531 performs surgery on a patient 532 on a patient bed 533 using an endoscopic surgical system 400. As illustrated, the endoscopic surgical system 400 includes an endoscope 500, other surgical instruments 510 such as a pneumoperitoneum tube 511 and an energy treatment instrument 512, a supporting arm device 520 for supporting the endoscope 500, and a cart 600 on which various devices for endoscopic surgery are mounted.

The endoscope 500 includes a lens tube 501 inserted into the body cavity of the patient 532 by a predetermined length from a distal end and a camera head 502 connected to a proximal end of the lens tube 501. The illustrated example shows that the endoscope 500 is a so-called rigid scope having a rigid lens tube 501. However, the endoscope 500 may be a so-called flexible scope having a flexible lens tube.

An opening in which an objective lens is fitted is provided at the distal end of the lens tube 501. A light source device 603 is connected to the endoscope 500, and light generated by the light source device 603 is guided to the distal end of the lens tube by a light guide extending in the lens tube 501 and is emitted to a target to be observed in the body cavity of the patient 532 through the objective lens. Note that the endoscope 500 may be a forward-viewing endoscope, an oblique-viewing endoscope, or a side-viewing endoscope.

An optical system and an imaging element are provided in the camera head 502, and light reflected by the target to be observed (observation light) is condensed on the imaging element by the optical system. The imaging element photoelectrically converts the observation light and generates an electric signal corresponding to the observation light, that is, an image signal corresponding to an observation image. The image signal is transmitted to a camera control unit (CCU) 601 as RAW data.

The CCU 601 includes a central processing unit (CPU), a graphics processing unit (GPU), and the like, and centrally controls the operations of the endoscope 500 and a display device 602. Moreover, the CCU 601 receives the image signal from the camera head 502 and applies various types of image processing for displaying an image based on the image signal, for example, a development process (demosaicing process) and the like on the image signal.

The display device 602 displays the image based on the image signal which has been subjected to the image processing by the CCU 601 under the control of the CCU 601.

The light source device 603 includes a light source such as a light emitting diode (LED), for example, and supplies irradiation light for imaging a surgical site or the like to the endoscope 500.

An input device 604 is an input interface for the endoscopic surgical system 11000. A user may input various kinds of information and instructions to the endoscopic surgical system 400 via the input device 604. For example, the user inputs an instruction to change the imaging conditions (type of irradiation light, magnification, focal length, etc.) or the like by the endoscope 500.

A treatment instrument control device 605 controls driving of the energy treatment instrument 512 for tissue cauterization, incision, blood vessel sealing, and the like. The pneumoperitoneum device 606 injects gas into the body cavity through the pneumoperitoneum tube 511 to inflate the body cavity of the patient 532 for the purpose of ensuring a field of view by the endoscope 500 and obtaining a working space of the operator. A recorder 607 is a device capable of recording various kinds of information regarding surgery. A printer 608 is a device capable of printing various kinds of information regarding surgery in various formats such as a text, an image, or a graph.

Note that the light source device 603 for supplying irradiation light for imaging the surgical site to the endoscope 500 may include, for example, an LED, a laser light source, or a white light source obtained by combining them. In a case where the white light source includes a combination of RGB laser light sources, an output intensity and an output timing of each color (each wavelength) can be controlled with high accuracy, whereby the light source device 603 can adjust white balance of the captured image. Furthermore, in this case, images respectively corresponding to the R, G, and B can also be captured in time division by irradiating the target to be observed with laser light from each of the RGB laser light sources in time division, and controlling the driving of the imaging element of the camera head 502 in synchronization with the irradiation timing. According to this method, a color image can be obtained without providing a color filter in the imaging element.

Furthermore, the driving of the light source device 603 may be controlled such that the intensity of light to be output is changed every predetermined time. The driving of the imaging element of the camera head 502 is controlled in synchronization with a timing of changing the light intensity to obtain the images in time division, and the obtained images are synthesized, whereby an image with a high dynamic range that does not have so-called blocked up shadows and blown-out highlights can be generated.

Furthermore, the light source device 603 may be configured to be able to supply light of a predetermined wavelength band adapted to special light observation. In the special light observation, so-called narrow band imaging is performed in which a predetermined tissue such as a blood vessel in a mucosal surface layer is imaged with high contrast by applying, for example, light in a narrower band than that of irradiation light (in other words, white light) used in normal observation using wavelength dependency of absorption of light in a body tissue. Alternatively, in the special light observation, fluorescence observation for obtaining an image with fluorescence generated by applying excitation light may be performed. In the fluorescence observation, it is possible to irradiate the body tissue with excitation light to observe fluorescence from the body tissue (autofluorescence observation) or to locally inject a reagent such as indocyanine green (ICG) to the body tissue and irradiate the body tissue with excitation light corresponding to a fluorescent wavelength of the reagent, thereby obtaining a fluorescent image, for example. The light source device 603 can be configured to be able to supply narrow band light and/or excitation light adapted to such special light observation.

Figure 33:
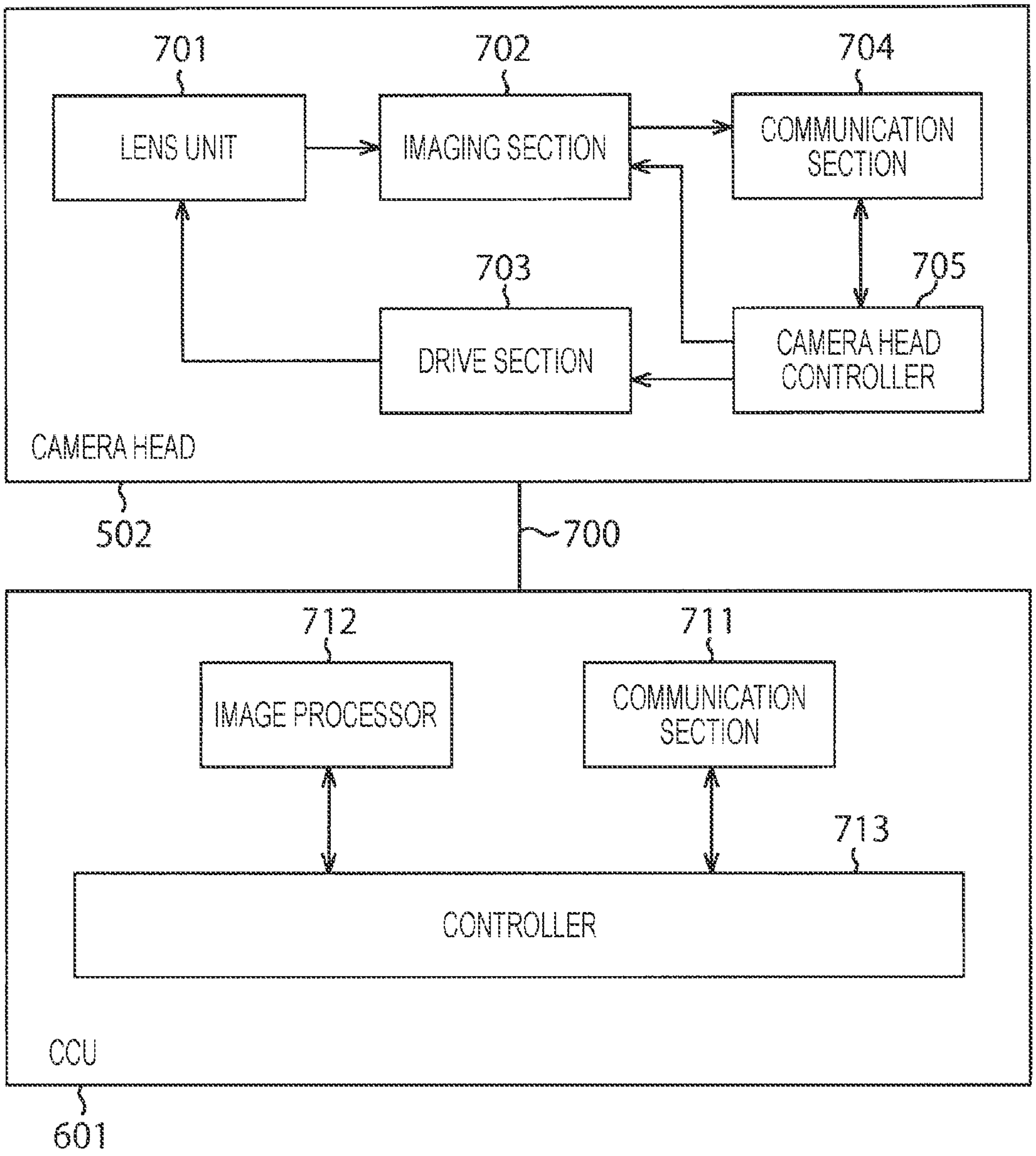
FIG. 33 is a block diagram depicting an example of a functional configuration of a camera head and a CCU.

FIG. 33 is a block diagram depicting an example of functional configurations of the camera head 502 and the CCU 601 depicted in FIG. 32.

The camera head 502 includes a lens unit 701, an imaging section 702, a drive section 703, a communication section 704, and a camera head controller 705. The CCU 601 includes a communication section 711, an image processor 712, and a controller 713. The camera head 502 and the CCU

601 are connected to each other so as to be able to communicate by a transmission cable 700.

The lens unit 701 is an optical system provided at a connecting portion with the lens tube 501. The observation light captured from the distal end of the lens tube 501 is guided to the camera head 502 and enters the lens unit 701. The lens unit 701 is constructed by combining a plurality of lenses including a zoom lens and a focusing lens.

The imaging section 702 includes an imaging element. The number of imaging element constituting the imaging section 702 may be one (so-called single plate type) or two or more (so-called multiple plate type). In a case where the imaging section 702 is of the multiple plate type, the image signals corresponding to RGB may be generated by the respective imaging elements, and a color image may be obtained by combining the generated image signals, for example. Alternatively, the imaging section 702 may include a pair of imaging elements for obtaining right-eye and left-eye image signals corresponding to three-dimensional (3D) display. By the 3D display, the operator 531 may grasp a depth of the living tissue in the surgical site more accurately. Note that, in a case where the imaging section 702 is of the multiple plate type, a plurality of systems of lens units 701 may be provided so as to correspond to the respective imaging elements. The imaging section 702 is, for example, the solid-state imaging device according to the sixth embodiment.

Furthermore, the imaging section 702 is not necessarily provided in the camera head 502. For example, the imaging section 702 may be provided inside the lens tube 501 immediately behind the objective lens.

The drive section 703 includes an actuator and moves the zoom lens and the focusing lens of the lens unit 701 by a predetermined distance along an optical axis under the control of the camera head controller 705. Thus, the magnification and focal point of the image captured by the imaging section 702 may be appropriately adjusted.

The communication section 704 includes a communication device for transmitting and receiving various types of information to and from the CCU 601. The communication section 704 transmits the image signal obtained from the imaging section 702 as the RAW data to the CCU 601 via the transmission cable 700.

Furthermore, the communication section 704 receives a control signal for controlling the drive of the camera head 502 from the CCU 601 and supplies the same to the camera head controller 705. The control signal includes, for example, information regarding imaging conditions such as information specifying a frame rate of the captured image, information specifying an exposure value during image capture, and/or information specifying the magnification and focal point of the captured image.

Note that the imaging conditions such as the abovementioned frame rate, exposure value, magnification, and focal point may be appropriately specified by the user or automatically set by the controller 713 of the CCU 601 on the basis of the obtained image signal. In the latter case, the endoscope 500 is equipped with a so-called auto exposure (AE) function, an auto focus (AF) function, and an auto white balance (AWB) function.

The camera head controller 705 controls the drive of the camera head 502 on the basis of the control signal from the CCU 601 received via the communication section 704.

The communication section 711 includes a communication device for transmitting and receiving various types of information to and from the camera head 502. The communication section 711 receives the image signal transmitted from the camera head 502 via the transmission cable 700.

Furthermore, the communication section 711 transmits the control signal for controlling the drive of the camera head 502 to the camera head 502. The image signal and the control signal may be transmitted by electric communication, optical communication, and the like.

The image processor 712 performs various types of image processing on the image signal which is the RAW data transmitted from the camera head 502.

The controller 713 performs various types of control regarding image capture of the surgical site and the like by the endoscope 500 and display of the captured image obtained by image capture of the surgical site and the like. For example, the controller 713 generates the control signal for controlling drive of the camera head 502.

Furthermore, the controller 713 allows the display device 602 to display the captured image including the surgical site and the like on the basis of the image signal subjected to the image processing by the image processor 712. At that time, the controller 713 may recognize various objects in the captured image using various image recognition technologies. For example, the controller 713 may detect an edge shape, a color, and the like of the object included in the captured image, thereby recognizing the surgical instrument such as forceps, the specific living-body site, bleeding, mist when the energy treatment instrument 512 is used, and the like. When allowing the display device 602 to display the captured image, the controller 713 may overlay various types of surgery support information on the image of the surgical site using a recognition result. The surgery support information is displayed as overlaid, and presented to the operator 531, so that it is possible to reduce the burden on the operator 531 and enable the operator 531 to reliably proceed with surgery.

The transmission cable 700 connecting the camera head 502 and the CCU 601 is an electric signal cable corresponding to communication of electric signals, an optical fiber compatible with optical communication, or a composite cable thereof.

Here, in the illustrated example, the communication is performed by wire using the transmission cable 700, but the communication between the camera head 502 and the CCU 601 may be performed wirelessly.

While the embodiments of the present disclosure have been described above, the embodiments may be implemented with various modifications without departing from the scope of the present disclosure. For example, two or more embodiments may be implemented in combination.

It is to be noted that the present disclosure may have the following configurations.

(1)

A semiconductor device including:
- a substrate;
- a first resistance layer provided on the substrate;
- a first electrode in contact with a lower surface of the first resistance layer; and
- a second electrode in contact with an upper surface of the first resistance layer.

(2)

The semiconductor device according to (1), further including:
- a first wire in contact with a lower surface of the first electrode; and
- a second wire in contact with an upper surface of the second electrode.

(3)

The semiconductor device according to (1), in which the first electrode is in contact with an upper surface of the substrate.

(4)

The semiconductor device according to (1), in which the first resistance layer includes a first layer and a second layer having an electrical resistivity lower than an electrical resistivity of the first layer, and the second layer includes a first portion that is provided on a side of the first electrode and a second portion that is provided on a side of the second electrode, the second portion being separated from the first portion.

(5)

The semiconductor device according to (4), in which the first electrode is disposed at a position vertically overlapping the first portion, and the second electrode is disposed at a position vertically overlapping the second portion.

(6)

The semiconductor device according to (4), in which the first layer contains a metal element and a silicon element.

(7)

The semiconductor device according to (4), in which the second layer is provided on a lower surface of the first layer.

(8)

The semiconductor device according to (4), in which the second layer is provided on an upper surface of the first layer.

(9)

The semiconductor device according to (7), in which the second electrode penetrates the first layer.

(10)

The semiconductor device according to (7), in which the second electrode is in contact with the second layer.

(11)

The semiconductor device according to (7), in which the second layer has a tapered side surface, and the first layer is in contact with an upper surface and the tapered side surface of the second layer.

(12)

The semiconductor device according to (1), further including:

a second resistance layer provided on the substrate;

a third electrode that is in contact with a lower surface of the second resistance layer and is electrically connected to the second electrode; and a fourth electrode in contact with an upper surface of the second resistance layer.

(13)

The semiconductor device according to (12), further including:

a first wire in contact with a lower surface of the first electrode;

a second wire in contact with an upper surface of the second electrode and a lower surface of the third electrode; and a third wire in contact with an upper surface of the fourth electrode.

(14)

The semiconductor device according to (13), in which at least one of a set of the second electrode and the second wire or a set of the third electrode and the third wire forms a dual damascene wire.

(15)

The semiconductor device according to (1), in which the first resistance layer is provided between a photoelectric conversion element and a signal processing circuit.

(16)

The semiconductor device according to (15), in which the photoelectric conversion element is provided in the substrate.

(17)

The semiconductor device according to (15), in which the photoelectric conversion element is a single photon avalanche diode (SPAD).

(18)

The semiconductor device according to (15), in which the substrate includes a first surface on which the first resistance layer, the first electrode, and the second electrode are provided, and a second surface provided with a lens that allows light to enter the photoelectric conversion element.

(19)

A method for manufacturing a semiconductor device, the method including:

forming a first electrode on a substrate;

forming a first resistance layer in contact with an upper surface of the first electrode; and forming a second electrode in contact with an upper surface of the first resistance layer.

(20)

The method for manufacturing a semiconductor device according to (19), in which the first resistance layer is formed to have a first layer and a second layer having an electrical resistivity lower than an electrical resistivity of the first layer, and the second layer is formed to have a first portion that is provided on a side of the first electrode and a second portion that is provided on a side of the second electrode and is separated from the first portion.

REFERENCE SIGNS LIST

1 Substrate
1*a* N− type semiconductor region
1*b* P type semiconductor region
1*c* N type semiconductor region
1*d* P type semiconductor region
2, 2*a*, 2*b*, 2*c* Interlayer insulating film
3 Wire
4 Plug electrode
5 Resistance layer
5*a* High-resistance layer
5*b* Low-resistance layer
6, 6*a*, 6*b*, 6*c*, 6' Plug electrode
7, 7*a*, 7*b*, 7' Wire
8, 8' Plug electrode
9, 9' Metal pad
11 Barrier metal layer
12 Plug material layer
13 Barrier metal layer
14 Plug material layer
21 Plug electrode
22 Resistance layer
23 Plug electrode
24 Wire
25 Dual damascene wire
26 Dual damascene wire
31 Pixel
32 Pixel array region

41 Support substrate
42 Interlayer insulating film
43, 43' Plug electrode
44, 44' Metal pad
51 Electrode
52 Pixel isolation portion
52*a* Element isolation insulating film
52*b* Light shielding film
53 Planarization film
54 Color filter
55 On-chip lens
56 Wire
57 Insulating film
58 Plug electrode

What is claimed is:

1. A semiconductor device, comprising:
a substrate;
a first resistance layer provided on the substrate;
a first electrode in contact with a lower surface of the first resistance layer; and
a second electrode in contact with an upper surface of the first resistance layer,
wherein the first resistance layer includes a first layer and a second layer having an electrical resistivity lower than an electrical resistivity of the first layer,
wherein the second layer includes a first portion having a bottom surface that is connected with the first electrode and a second portion having a top surface that is coupled with the second electrode via the first resistance layer,
wherein the second portion is separated from the first portion and a bottom surface of the second portion is free of electrical connection.

2. The semiconductor device according to claim 1, further comprising:
a first wire in contact with a lower surface of the first electrode; and
a second wire in contact with an upper surface of the second electrode.

3. The semiconductor device according to claim 1, wherein the first electrode is in contact with an upper surface of the substrate.

4. The semiconductor device according to claim 1, wherein
the first electrode is disposed at a position vertically overlapping the first portion, and
the second electrode is disposed at a position vertically overlapping the second portion.

5. The semiconductor device according to claim 1, wherein the first layer contains a metal element and a silicon element.

6. The semiconductor device according to claim 1, wherein the second layer is provided on a lower surface of the first layer.

7. The semiconductor device according to claim 6, wherein the second electrode penetrates the first layer.

8. The semiconductor device according to claim 6, wherein the second electrode is in contact with the second layer.

9. The semiconductor device according to claim 6, wherein
the second layer has a tapered side surface, and
the first layer is in contact with an upper surface and the tapered side surface of the second layer.

10. The semiconductor device according to claim 1, further comprising:
a second resistance layer provided on the substrate;
a third electrode that is in contact with a lower surface of the second resistance layer and is electrically connected to the second electrode; and
a fourth electrode in contact with an upper surface of the second resistance layer.

11. The semiconductor device according to claim 10, further comprising:
a first wire in contact with a lower surface of the first electrode;
a second wire in contact with an upper surface of the second electrode and a lower surface of the third electrode; and
a third wire in contact with an upper surface of the fourth electrode.

12. The semiconductor device according to claim 11, wherein at least one of a set of the second electrode and the second wire or a set of the third electrode and the third wire forms a dual damascene wire.

13. The semiconductor device according to claim 1, wherein the first resistance layer is provided between a photoelectric conversion element and a signal processing circuit.

14. The semiconductor device according to claim 13, wherein the photoelectric conversion element is provided in the substrate.

15. The semiconductor device according to claim 13, wherein the photoelectric conversion element is a single photon avalanche diode (SPAD).

16. The semiconductor device according to claim 13, wherein
the substrate includes
a first surface on which the first resistance layer, the first electrode, and the second electrode are provided, and
a second surface provided with a lens that allows light to enter the photoelectric conversion element.

17. A method for manufacturing a semiconductor device, the method comprising:
forming a first electrode on a substrate;
forming a first resistance layer in contact with an upper surface of the first electrode; and
forming a second electrode in contact with an upper surface of the first resistance layer,
wherein the first resistance layer is formed to have a first layer and a second layer having an electrical resistivity lower than an electrical resistivity of the first layer,
wherein the second layer is formed to have a first portion having a bottom surface that is connected with the first electrode and a second portion having a top surface that is coupled with the second electrode via the first resistance layer, and
wherein the second portion is separated from the first portion and a bottom surface of the second portion is free of electrical connection.

18. The method for manufacturing a semiconductor device according to claim 17, wherein the first electrode is in contact with an upper surface of the substrate.

19. The method for manufacturing a semiconductor device according to claim 17, wherein the first layer contains a metal element and a silicon element.

* * * * *